United States Patent
Taniguchi et al.

(10) Patent No.: US 6,222,365 B1
(45) Date of Patent: Apr. 24, 2001

(54) MAGNETIC RESONANCE IMAGING APPARATUS AND METHOD

(75) Inventors: Yo Taniguchi; Hisaaki Ochi, both of Kodaira; Kenichi Okajima, Mitaka; Satoshi Hirata, Kokubunji, all of (JP)

(73) Assignee: Hitachi Medical Corporation, Tokyo (JP)

( * ) Notice: Subject to any disclaimer, the term of this patent is extended or adjusted under 35 U.S.C. 154(b) by 0 days.

(21) Appl. No.: 09/155,245

(22) PCT Filed: Mar. 27, 1997

(86) PCT No.: PCT/JP97/01055

§ 371 Date: Jan. 21, 1999

§ 102(e) Date: Jan. 21, 1999

(87) PCT Pub. No.: WO97/35517

PCT Pub. Date: Oct. 2, 1997

(30) Foreign Application Priority Data

Mar. 28, 1996 (JP) ................................. 8-074960

(51) Int. Cl.$^7$ ......................................... G01V 3/00
(52) U.S. Cl. .................... 324/309; 324/307; 324/318
(58) Field of Search .................................. 324/309, 307, 324/318, 322, 311, 313, 300

(56) References Cited

U.S. PATENT DOCUMENTS

| | | | |
|---|---|---|---|
| 4,665,367 | 5/1987 | Kramer et al. | 324/309 |
| 5,126,673 | 6/1992 | Hennig | 324/309 |

FOREIGN PATENT DOCUMENTS

| | | |
|---|---|---|
| 58-55740 | 4/1983 | (JP) . |
| 61-106140 | 5/1986 | (JP) . |
| 64-62142 | 3/1989 | (JP) . |
| WO97/00743 | 1/1990 | (WO) . |
| WO93/02618 | 2/1993 | (WO) . |

OTHER PUBLICATIONS

IEEE Transactions on Medical Imaging, vol. MI–5, No. 2, Jun. 1986, "Optimal Control Solutions to the Magnetic Resonance Selective Excitation Problem", S. Conolly et al, pp. 106–115.

Journal of Magnetic Resonance, vol. 82, 1989, "Spatial Localization in Two Dimensions Using NMR Designer Pulses", C. Hardy et al, pp. 647–654.

"Fast Volume Scanning with Frequency–Shifted Burst MRI", J. Duyn et al, pp. 429–432.

Jakob et al, "Radial Burst Imaging", Proceedings of the Society of Magnetic Resonance, Third Scientific Meeting and Exhibition, and the European Society for Magnetic Resonance in Medicine and Biology, Twelfth Annual Meeting and Exhibition, Nice, France, Aug. 1995, vol. 1, p. 482.

Zha et al, "Optimized Ultra–Fast Imaging Sequence (OUFIS)", Magnetic Resonance in Medicine, Mar. 1995, vol. 33, No. 3, pp. 377–395.

*Primary Examiner*—Christine Oda
*Assistant Examiner*—Brij B. Shrivastav
(74) *Attorney, Agent, or Firm*—Mattingly, Stanger & Malur, P.C.

(57) ABSTRACT

In a magnetic resonance imaging apparatus including a pulse sequence control unit for controlling a pulse sequence to acquire echoes while both a radio frequency magnetic field and a gradient magnetic field are applied to an object under examination present in a static magnetic field; and an image reconstructing unit for reconstructing an image based upon the acquired echoes, the pulse sequence control unit is comprised of a spatial resolution control unit for setting spatial resolution A along a readout gradient magnetic field direction of the reconstructed image; and a gradient magnetic field strength control unit for applying such a readout gradient magnetic field that spatial resolution B determined by a strength of the readout gradient magnetic field and a sampling period becomes coarser than the spatial resolution A. The image reconstructing unit reconstructs an image while a minimum unit of the spatial resolution A is set as a width of one pixel of a reconstructed image along a readout direction.

65 Claims, 21 Drawing Sheets

MAGNETIC RESONANCE IMAGING APPARATUS AND METHOD

TECHNICAL FIELD

The present invention is related to a magnetic resonance imaging (MRI) apparatus, and more specifically, is related to a technique for imaging an image with high resolution under a low readout gradient magnetic field strength.

BACKGROUND ART

A conventional examining apparatus with using a magnetic resonance, namely a conventional magnetic resonance apparatus (will be simply referred to as an "examining apparatus" hereinafter) is made of an arrangement, for example, as shown in FIG. 26.

In FIG. 26, reference numeral 2601 indicates a magnet for generating a static magnetic field, reference numeral 2602 represents a gradient magnetic field generating coil for generating a gradient magnetic field, and reference numeral 2603 shows an object under examination. This object 2603 under examination is set within the static magnetic field generating magnet 2601 and the gradient magnetic field generating 2602.

Also, a sequencer 2604 sends a command to a gradient magnetic field power supply 2605 and also a radio frequency pulse generator 2606 so as to generate a gradient magnetic field and an RF (radio frequency) magnetic field. This RF magnetic field is applied via a probe 2607 to the object 2603 under examination.

On the other hand, a signal produced from the object 2603 under examination is received by the probe 2607 and then is detected by a receiver 2608.

The detected signal is supplied to a computer 2609 in which a signal process operation such as an image reconstruction is carried out. The process result is displayed on a display 2610. It should be noted that the signals and the measuring conditions may be stored in a storage medium 2611, if required.

In the case that uniformity of the static magnetic field must be adjusted, a shim coil 2612 is used. The shim coil 2612 is constituted by a plurality of channels to which currents are supplied from a shim power supply 2613. While the uniformity of the static magnetic field is adjusted, the currents flowing through the respective coils are controlled by the sequencer 2604. At this time, the sequencer 2604 sends a command to the shim power supply 2613 in order to produce from the shim coil 2612, such an additional magnetic field capable of correcting nonuniform static magnetic fields.

It should also be noted that the sequencer 2604 normally controls the respective apparatuses in such a way that these apparatuses are operated at the preprogrammed timing and strengths. Among these programs, such a program for especially describing the RF magnetic field, the gradient magnetic field, and the timing/strengths of the signal receptions is referred to as a "pulse sequence".

Next, the imaging sequential operation with employment of the examining apparatus shown in FIG. 26 will now be summarized with reference to the spin echo method corresponding to a typical pulse sequence indicated in FIG. 27.

The object 2603 under examination is set within the static magnetic field, and while a slice gradient magnetic field 201 is applied, a magnetic excitation radio frequency magnetic field (RF) pulse 202 is applied, so that a magnetic resonance phenomenon is induced in a certain slice within a target.

Next, a phase encode gradient magnetic pulse 204 for applying positional information along a phase encode direction to a phase of magnetization is applied, and a 180-degree pulse 205 is applied. Thereafter, while a readout magnetic field pulse 206 for applying positional information along a readout direction is applied, a magnetic resonance signal (echo) 203 is measured.

To measure data required to acquire 1 image, the above-described sequential operation is repeatedly performed to measure a plurality of echoes. At this time, since several seconds are required in order that the once excited magnetization is returned to the equilibrium condition, normally, a waiting time period equal to several seconds is needed after the echo measurement is completed until next excitation.

In general, the sampling point numbers of the echo are usually 64 to 512 per 1 echo, and a total number of echoes to be measured is 64 to 256.

After a measurement is accomplished, echoes are arranged on a frequency space (K space, measuring space) of an image, as shown in FIG. 28. Then, an image is reconstructed by executing a 2-dimensional Fourier transform to thereby acquire a tomographic image. A matrix number of the image becomes (sampling point of single echo)×(echo number) of this time.

A field of view "Wx" along the readout direction, and a pixel size "ΔWx" may be expressed by the below-mentioned formulae (1) and (2), assuming now that the strength of the readout gradient magnetic field is "Gx", the sampling rate (sampling interval) is "Δt", and the sampling point is "N";

$$\Delta Wx = 1/(\gamma \times Gx \times \Delta t \times N) \tag{1}$$

$$Wx = \Delta Wx \times N \tag{2}$$

In these formulae, symbol "γ" represents a gyromagnetic ratio of an atom under measurement. As to proton which is normally imaged, this gyromagnetic ratio is equal to approximately 42.5759 MHz/T.

As apparent from these formulae (1) and (2), the following methods are conceivable as the microscopy method for acquiring images with high resolution. That is, either the sampling rate Δt or the gradient magnetic field Gx is increased, or both the sampling rate Δt and the gradient magnetic field Gx are increased. Alternatively, the sampling point number N is increased.

In a general-purpose microscopy, resolution is increased by increasing the gradient magnetic field. Normally, such a gradient magnetic field having a very strong magnetic field strength, e.g., on the order of 100 to 1000 mT/m.

In this case, since the measuring time of the echoes is not prolonged, the attenuation of the signal strength caused by relaxations of the magnetization, and also the adverse influence caused by the nonuniform static magnetic field can be suppressed, and therefore, the deterioration in the image quality can be reduced, as compared with another microscopy method in which a sampling rate and a sampling point number are increased.

The Inventors of the present invention could find out the below-mentioned problems by considering the above-explained prior art microscopy methods.

To perform the microscopy in the clinical MRI apparatus corresponding to the conventional magnetic resonance imaging apparatus directed to measure the human body, this clinical MRI apparatus is required to be installed within a room such as an examining room having a limited space. Also, a better linearity is required over a wide area having a diameter of approximately 40 cm, and furthermore the gradient magnetic field having such a strong magnetic field of on the order of 100 to 1000 mT/m must be produced.

However, although such a strong gradient magnetic field can be produced in a compact magnetic resonance imaging apparatus for an analysis purpose, there is such a problem that this strong gradient magnetic field could not be produced in the wide area having the diameter of approximately 40 cm.

Also, there is another problem that since the magnetic field is rapidly changed in connection with the generation of such a strong gradient magnetic field, the adverse influence given to the human body, namely the load loaded to the human body is not negligible.

There is such a research example that the magnetic resonance imaging was carried out for several tens of minutes under the low gradient magnetic field. However, even when this magnetic resonance imaging is tried to be applied to the clinical purpose, it is impossible to realize such a magnetic resonance imaging due to a limitation of imaging time.

It should be understood that the gradient magnetic field strength which can be produced in the presently available clinical MRI apparatus is selected to be on the order of 30 mT/m at maximum.

DISCLOSURE OF INVENTION

An object of the present invention is to provide a magnetic resonance imaging apparatus and also a magnetic resonance imaging method, which can be applied to a microscopy even for a human body without requiring a strong gradient magnetic field.

A basic idea of the present invention will now be described with reference to FIG. 29A and FIG. 29B.

FIG. 29A and FIG. 29B show projection images produced by inverse-Fourier-transforming one of magnetic resonance signals (echoes) acquired by a preselected pulse sequence. FIG. 29A indicates a projection image acquired by the conventional MRI apparatus, whereas FIG. 29B represents a projection image acquired in accordance with the present invention. An abscissa indicates a readout direction, and an ordinate indicates a intensity of projection.

In general, spatial resolution of an image may be expressed by the following formula, assuming now that the readout gradient magnetic field is "Gx", the sampling rate is "$\Delta t$", and the sampling point number is "N":

$$\text{spatial resolution} = \frac{1}{\gamma G_x \cdot \Delta t \cdot N} \quad (3)$$

In FIG. 29A, a scale "x1" represents spatial resolution determined by both the readout gradient magnetic field and the sampling period ($\Delta t \times N$). Conventionally, this range is indicated as 1 pixel of a reconstructed image. Also, the entire region indicated as 1 pixel is conventionally excited to acquire the image data.

As apparent from FIG. 29B, in accordance with the present invention, a region (dx) which is very narrower than the conventional 1 pixel region (x1) is set as 1 pixel of a reconstructed image. This region dx is spatial resolution determined by the radio frequency magnetic field and the readout gradient magnetic field strength. In accordance with the present invention, as indicated by a broken line shown in FIG. 29B, while the regions within the conventional 1 pixel are imaged plural times by varying the excitation position, the overall image data is acquired. According to the present invention, only a portion of the region conventionally displayed as 1 pixel is excited, and this excited partial region is set as a new pixel, so that the spatial resolution can be increased.

Now, the present invention will be simply summarized.

First, in accordance with a magnetic resonance imaging apparatus of the present invention, a minimum unit of spatial resolution "A" determined by a spatial resolution control unit is set as a width of 1 (one) pixel along a readout direction of an image by an image reconstructing unit. Concretely speaking, a width of each slice in a slice group excited by irradiating a radio frequency (RF) magnetic field is set as the minimum unit of the spatial resolution.

Next, the spatial resolution control unit irradiates a plurality of RF magnetic fields to an object under examination present in a static magnetic field, while applying a gradient magnetic field along the readout direction. As a result the object under examination is excited in a slice group whose slices are positioned in an equi-interval and perpendicular to the readout gradient field.

Next, the gradient magnetic field control unit applies such a readout gradient magnetic field to the object under examination, by which spatial resolution "B" becomes lower than the spatial resolution "A" determined by the spatial resolution control unit, in other words, the spatial resolution "B" becomes coarse. This spatial resolution "B" is determined by the strength of the readout gradient magnetic field and the sampling period. Concretely speaking, the gradient magnetic field control unit applies such a readout gradient magnetic field that the spatial resolution B is equal to the slice interval.

While a position of a slice is moved in a direction along which the readout gradient magnetic field is applied with respect to a width of a slice, an echo is measured under such a condition that 1 pixel in the readout direction is used as the minimum unit of the spatial resolution A by measuring the echo.

As a consequence, since an image can be constructed while setting the slice thickness as the width of one pixel by constructing an image by the image reconstructing unit based on this echo, a microscopy can be applied also to a human body.

A structure of a magnetic resonance imaging apparatus capable of realizing the present invention is represented in the below-mentioned description:

(1) In a magnetic resonance imaging apparatus including a pulse sequence control unit for controlling a pulse sequence to acquire echoes while both a radio frequency magnetic field and a gradient magnetic field are applied to an object under examination present in a static magnetic field; and an image reconstructing unit for reconstructing an image based upon the acquired echoes, said pulse sequence control unit is comprised of a spatial resolution control unit for setting spatial resolution along a readout gradient magnetic field direction of said reconstructed image; and a gradient magnetic field strength control unit for applying such a readout gradient magnetic field that spatial resolution determined by a strength of a readout gradient magnetic field becomes lower (or coarser) than the spatial resolution set by said spatial resolution control unit.

(2) In the magnetic resonance imaging apparatus as recited in the above-described item (1), said image reconstructing unit sets a minimum unit of the spatial resolution set by the spatial resolution control unit as a width of 1 pixel along the readout direction of the image.

(3) In the magnetic resonance imaging apparatus as recited in the above-described item (1) or (2), said spatial resolution control unit sets the spatial resolution by irradiating the radio frequency magnetic field so as to selectively excite a portion of the object under examination.

(4) In the magnetic resonance imaging apparatus as recited in the above-described item (3), said spatial resolution control unit excites a region within the object under examination in a slice group whose slices are located substantially perpendicular to said readout gradient magnetic field direction, and are positioned in a substantially equi-interval; and said gradient magnetic field strength control unit makes spatial resolution determined by the strength of the readout gradient magnetic field and a sampling period substantially equal to the interval of said slices.

(5) In the magnetic resonance imaging apparatus as recited in the above-described item (4), said spatial resolution control unit applies an excitation gradient magnetic field along the same direction of said readout gradient magnetic field, and also irradiates said radio frequency magnetic field pulses plural times in the substantially equi-interval.

(6) In the magnetic resonance imaging apparatus as recited in above-described item (4) or (5), said pulse sequence control unit executes a first pulse sequence for acquiring echoes by applying both said radio frequency magnetic field and said gradient magnetic field, and also a second pulse sequence constituted by said spatial resolution control unit and said first pulse sequence; and said image reconstructing unit is comprised of a difference processing unit for executing a difference process operation between the echoes acquired by said first pulse sequence and the echoes acquired by said second pulse sequence.

(7) In the magnetic resonance imaging apparatus as recited in the above-described item (6), said difference processing unit executes the above-explained difference process operation with respect to the images reconstructed from the echoes acquired by the first pulse sequence and from the echoes acquired by the second pulse sequence.

(8) In the magnetic resonance imaging apparatus as recited in any one of the above-described items (5) to (7), amplitudes of said plurality of radio frequency magnetic field pulses are constant.

(9) In an magnetic resonance imaging apparatus as recited in any one of the above-described items (5) to (7), said plurality of radio frequency magnetic field pulses are amplitude-modulated.

(10) In an magnetic resonance imaging apparatus as recited in any one of the above-described items (5) to (7), said plurality of radio frequency magnetic field pulses are frequency-modulated, or phase-modulated.

(11) In an magnetic resonance imaging apparatus as recited in any one of the above-described items (4) to (10), said pulse sequence control unit repeatedly executes said pulse sequence preselected times, while the position of said slice group is moved in such a direction along which the readout gradient magnetic field is applied.

(12) In an magnetic resonance imaging apparatus as recited in any one of the above-described items (4) to (11), the frequency of said radio frequency magnetic field pulse is changed every time said pulse sequence is repeated.

(13) In an magnetic resonance imaging apparatus as recited in any one of the above-described items (4) to (11), the strength of the static magnetic field is changed every time said pulse sequence is repeated.

(14) In an magnetic resonance imaging apparatus as recited in any one of the above-described items (1) to (13), said pulse sequence applies a phase encode gradient magnetic field, while the echoes are acquired.

(15) In the magnetic resonance imaging apparatus as recited in the above-described item (14), the strength of said phase encode gradient magnetic field is substantially equal to that of said readout gradient magnetic field.

(16) In an magnetic resonance imaging apparatus as recited in any one of the above-described items (1) to (13), said pulse sequence repeatedly performs the echo acquisition while changing the readout gradient magnetic field direction.

(17) In an magnetic resonance imaging apparatus as recited in any one of the above-described items (1) to (16), said pulse sequence irradiates a 180-degree pulse between the portion used to excite the slice group within the object under examination and the measurement of echoes.

(18) In an magnetic resonance imaging apparatus as recited in any one of the above-described items (14) to (17), said magnetic resonance imaging apparatus is comprised of a pulse sequence for acquiring said plurality of echoes while repeatedly inverting said readout gradient magnetic field.

(19) In an magnetic resonance imaging apparatus as recited in any one of the above-described items (14) to (18), another pulse sequence for suppressing a signal of a region other than a region of interest is executed prior to the execution of said pulse sequence.

(20) In an magnetic resonance imaging apparatus as recited in any one of the above-described items (14) to (19), said image reconstructing unit multiplies a plurality of reconstructed images based upon the echoes acquired in the same pulse sequence.

(21) In an magnetic resonance imaging apparatus as recited in any one of the above-described items (1) to (20), the image reconstruction is carried out by using the echoes which have been measured at this time every time said pulse sequence is repeatedly performed.

(22) In the magnetic resonance image apparatus as recited in the above-described item (21), the reconstructed partial image is displayed on a display apparatus.

BEST MODE FOR CARRYING OUT THE INVENTION

Figure 1:
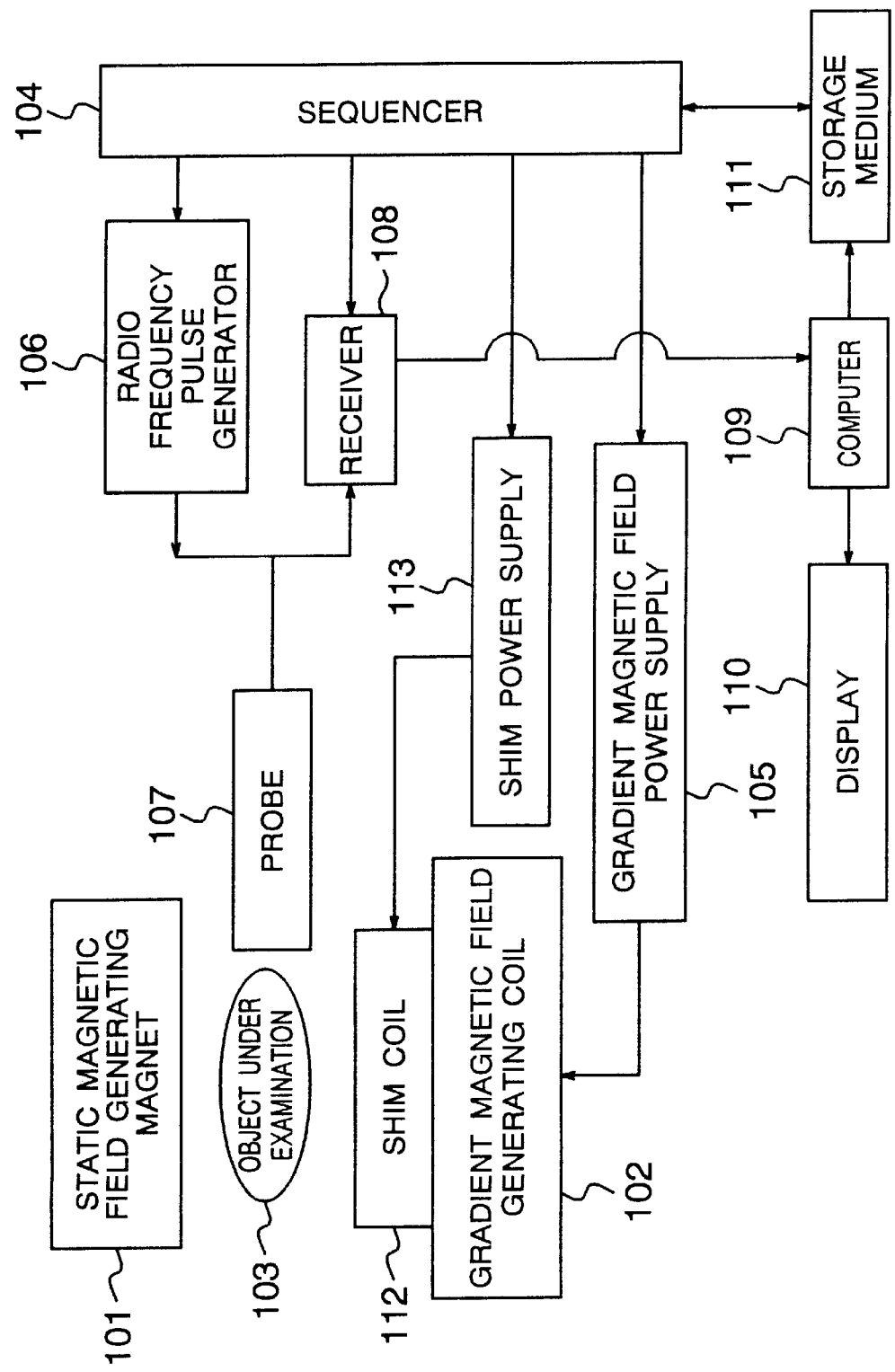
FIG. 1 is a block diagram for schematically showing an arrangement of a magnetic resonance imaging apparatus according to an embodiment mode 1 of the present invention.

Referring now to drawings, the present invention will be described in detail in connection with embodiment modes (embodiments) of the present invention.

It should be noted that the same reference numerals will be employed as those for denoting the components having the same functions in all drawings used to explain embodiment modes of the present invention, and therefore the same descriptions thereof are omitted.

EMBODIMENT MODE 1

FIG. 1 is a block diagram for schematically showing an arrangement of a magnetic resonance imaging apparatus according to an embodiment mode 1 of the present invention. Reference numeral 101 shows a static magnetic field generating magnet; reference numeral 102 represents a gradient magnetic numeral 103 indicates an object under examination; reference numeral 104 represents a sequencer (pulse sequence control unit); reference numeral 105 shows a gradient magnetic field power supply; and reference numeral 106 indicates a high frequency pulse generator. Also, reference numeral 107 indicates a probe; reference numeral 108 shows a receiver; reference numeral 109 is a computer (image reconstructing unit); reference numeral 110 shows a display; reference numeral 111 represents a storage medium; reference numeral 112 indicates a shim coil; and reference numeral 113 indicates a shim power supply.

In FIG. 1, the static magnetic field generating magnet 101 is such a well-known magnet for generating (producing) a static magnetic field. For instance, a permanent magnet, or a superconductive magnet.

The gradient magnetic field generating coil 102 is such a well-known coil for generating a gradient magnetic field. For example, while a body axial direction of the object 103 under examination is set as a Z-axis direction, and also both an X axis and a Y axis perpendicular to the X axis are set as a coordinate system for specifying a position within a plane located perpendicular to this Z axis, this gradient magnetic field generating coil 102 generates linear gradient magnetic fields Gx, Gy, and Gz, which own predetermined gradients along the respective X axis, Y axis, and Z axis directions.

Also, this gradient magnetic field generating coil 102 is connected to the gradient magnetic field power supply 105, and generates a gradient magnetic field in response to a current supplied from this power supply 105.

The sequencer 104 is such a well-known sequencer capable of presetting an operation sequence and the like. For example, the sequencer 104 receives a measuring sequence constructed in the computer 109 as data, and outputs operation signals to the radio frequency pulse generator 106, the receiver 108, the shim power supply 113, the storage medium 111, and the like based upon the order or sequence of this data so as to control the apparatuses.

The gradient magnetic field power supply 105 is such a well-known power supply. For example, the gradient magnetic field power supply 105 is arranged by three sets of power supplies for driving the above-described respective gradient magnetic field generating coils 102 along the X axis direction, the Y axis direction, and the Z axis direction.

The radio frequency pulse generator 106 is such a circuit for generating a well-known selective excitation radio frequency pulse used to selectively choose a position of a slice to be measured. For example, the radio frequency pulse generator 106 is arranged by a well-known synthesizer for generating a radio frequency functioning as a reference, a modulating circuit for modulating the radio frequency produced by this synthesizer to obtain a predetermined signal, and an amplifier for amplifying the modulated electric signal.

The probe 107 is such a coil which converts the pulse generated by the radio frequency pulse generator 106, conducts this generated pulse to the object under examination so as to irradiate the conducted pulse to this object under examination, and also receives a signal (either echo signal or echo) emitted from the object under examination so as to conduct this received signal to the receiver 108.

The receiver 108 is such a circuit block which detects the echo radiated from the object under examination and conducted by the probe 107, and converts this detection result into a digital signal, and thereafter outputs the digital signal to the computer 109. The receiver 108 is arranged by a well-known A/D converter for converting an electric signal into digital information.

The computer 109 is such a well-known information processing apparatus (calculation processing unit) which, for example, outputs the above-described measuring sequence as set data, and also reconstructs a tomographic image based upon an echo.

The display 110 is such a well-known display apparatus for displaying a picture, or video signal outputted from the computer 109.

The storage medium 111 is such a well-known storage apparatus for storing thereinto measured echoes, tomographic images, measuring conditions, and sequences. For example, a magnetic disk apparatus, a semiconductor memory, a magneto-optical storage apparatus, a magnetic tape apparatus, and the like are employed as this storage medium 111.

The shim coil 112 is such a coil for generating a magnetic field used to maintain the uniformity of the static magnetic field generated by the static magnetic field generating magnet 101. A current is supplied from the shim power supply 113 to the shim coil 112.

The shim power supply 113 is such a shim power supply for supplying a current to the shim coil 112 based upon the output of the sequencer 104.

It should be noted that similar to the conventional apparatus, in the magnetic resonance imaging apparatus of the embodiment mode 1, such data for describing in particular the radio frequency magnetic field, the gradient magnetic field, the signal receiving timing, and the strength among the data of the measuring sequence set in the computer 109 will be referred to as a "pulse sequence".

Figure 2:
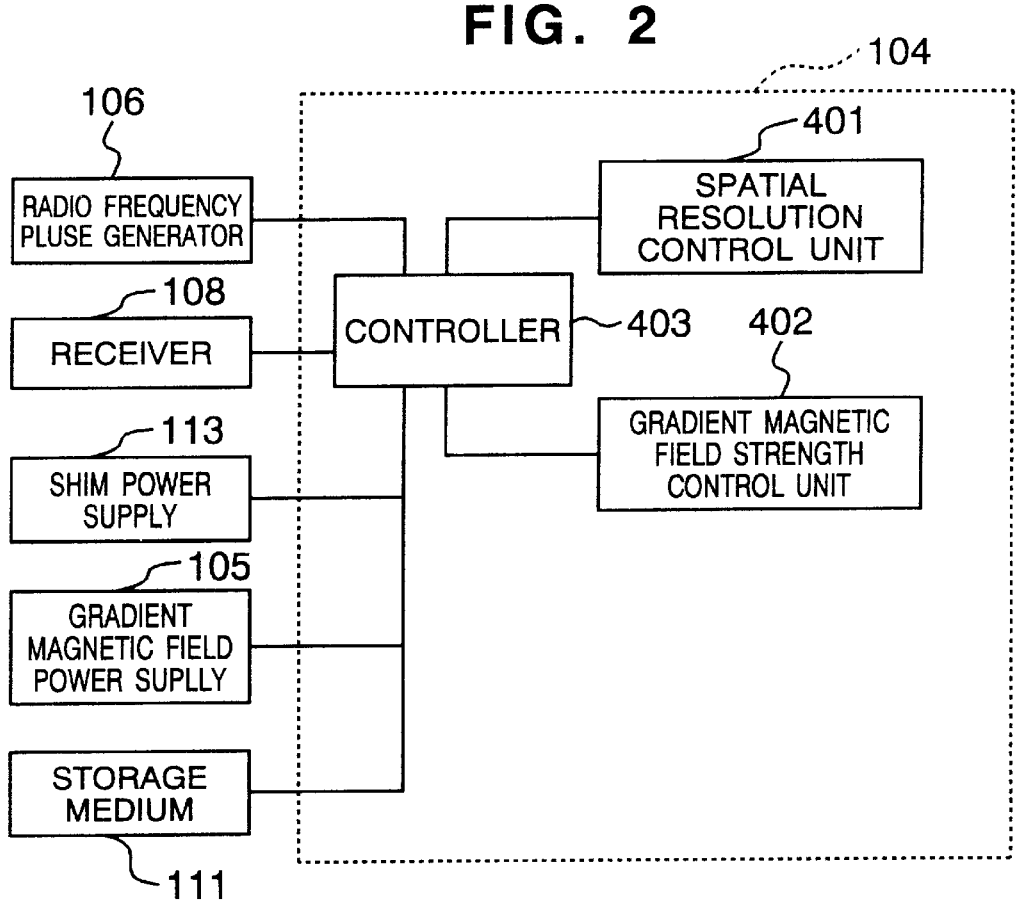
FIG. 2 is a block diagram for schematically indicating an arrangement of a sequencer of this embodiment mode 1.

FIG. 2 is a block diagram for schematically showing an arrangement of the sequencer according to this embodiment mode 1. Reference numeral 401 shows a spatial resolution control unit, reference numeral 402 represents a gradient magnetic field strength control unit, and reference numeral 403 indicates a controller.

The sequencer shown in FIG. 2 controls the radio frequency pulse generator 106, the receiver 108, the shim power supply 113, the gradient magnetic field power supply 105, and the storage medium 111 in accordance with a sequence (will be discussed later), so that spatial resolution of an image can be made higher than spatial resolution determined by a strength of a readout gradient magnetic field and a sampling time period.

Next, an operation of the sequencer is summarized. First, the spatial resolution control unit 401 controls both the radio frequency pulse generator 106 and the gradient magnetic field power supply 105, so that spatial resolution of an image to be imaged, or photographed is set.

Next, the gradient magnetic field strength control unit 402 controls the gradient magnetic field power supply 105 to set a readout gradient magnetic field strength when an echo is measured. It should also be noted that the gradient magnetic field strength control unit 402 controls the receiver 108 at the same time so as to also measure echoes. At this time, the spatial resolution determined by the strength of the readout gradient magnetic field and the sampling time period becomes lower than the spatial resolution set by the spatial resolution control unit 401, namely becomes coarse.

Figure 3:
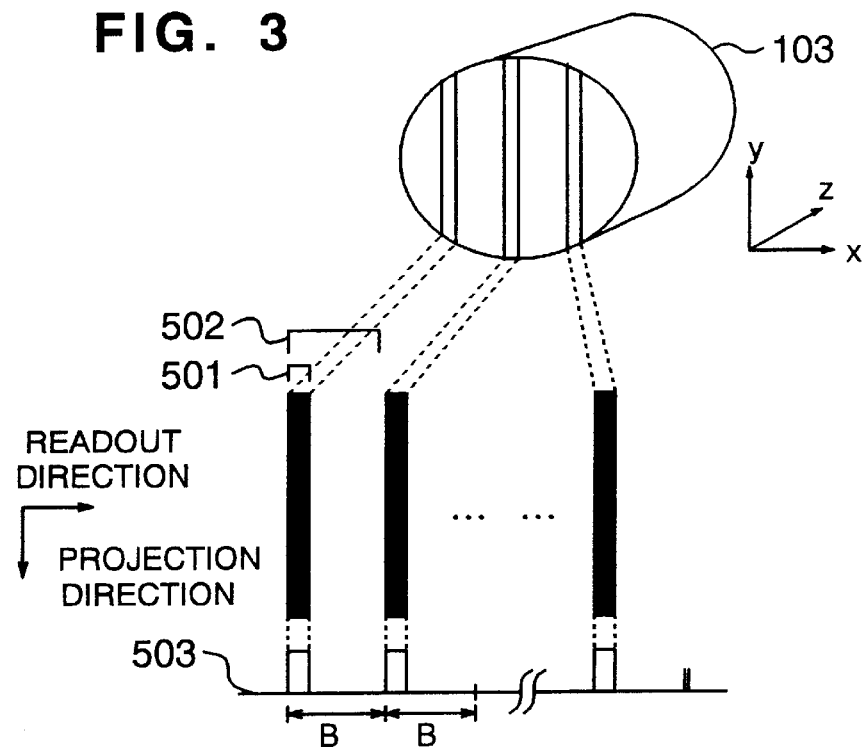
FIG. 3 is a diagram for explaining a relationship between spatial resolution set in a spatial resolution control unit and spatial resolution during a readout, set in a gradient magnetic field strength control unit.

FIG. 3 is an explanatory diagram for explaining a relationship between the spatial resolution set in the spatial resolution control unit and the spatial resolution during the readout, set in the gradient magnetic field strength control unit.

For the sake of simplicity, the explanatory diagram of FIG. 3 is indicated in a two-dimensional manner. FIG. 3 represents such an example that an inside of an object under examination is excited in a stripe shape with an equi-interval in the space resolution control unit 401.

Reference numeral 501 shows a width of a stripe, reference numeral 502 indicates an interval of the stripe, and reference numeral 503 indicates a projection (projection drawing) produced by processing echoes by way of the one-dimensional inverse Fourier transform.

Also, as to coordinate axes indicated by arrows in FIG. 3, an abscissa indicates a readout direction, and an ordinate indicates a projection direction.

A scale "B" in the project 503 is equal to the spatial resolution determined by the readout gradient magnetic field and the sampling time period.

Echoes are measured by setting a spatial resolution determined by the readout gradient magnetic field and the sampling time period so that it becomes equal to an interval 502 of the stripe, and the spatial resolution of the projection 503 which is obtained by inverse Fourier transform of one of the measured echoes is equal to the interval 502 of the stripe. However, the information included in it corresponds to the information of only portion of the stripe excited. Therefore, it can be said that the spatial resolution of the projection 503 is equal to the width 501 of the stripe.

As a consequence, when the acquired projection is displayed as an image, a minimum unit of the spatial resolution determined by the strength of the readout gradient magnetic field and the sampling time period, namely the interval 502 of the stripe in FIG. 3 is not set to 1 (one) pixel, but the width 501 of the stripe is set to 1 (one) pixel of an image. As a result, the image having the higher spatial resolution than the spatial resolution 502 determined by the readout gradient magnetic field strength and the sampling time period can be obtained.

It should be understood that only the projection of a portion of the object under examination can be measured during a single measurement as shown in this drawing.

As a consequence, in order to measure projection of the overall object under examination, while the position of the entire stripe is arbitrarily changed, the echoes must be repeatedly performed.

Figure 4:
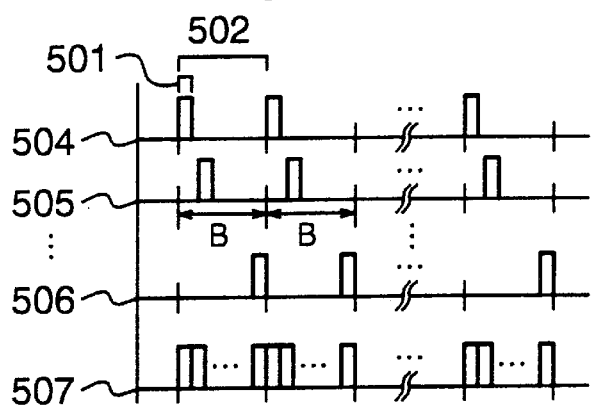
FIG. 4 is an illustration for representing an example of a measurement for echoes.

One example of the echo repetition measurement is illustrated in FIG. 4. Reference numerals 504, 505, and 506 show projections obtained by inverse-Fourier-transforming one of echoes measured by executing a first pulse sequence, a second pulse sequence, and a 16-th pulse sequence, respectively.

In other words, this shows such an image that a slice group is projected on the X axis. Another scale "B" is the same as in the case of FIG. 2.

On the other hand, reference numeral 507 indicates a complete projection obtained by synthesizing the projections with each other, which are acquired from the first pulse sequence to the 16-th pulse sequence.

In this example, when the respective sequences after the second pulse sequence are executed, the excitation is carried out in such a manner that the position of the overall stripe is shifted by the number obtained by multiplying the width of the stripe by an integer with respect to the stripe which was excited during the measurement immediately before the present measurement. FIG. 4 represents such an example that the position of the overall stripe is successively shifted only by the width of 1 stripe.

At this time, if the interval of the stripe is equal to the number obtained by multiplying the width of the stripe by "m", then "m" times (in total) of pulse sequences are repeatedly performed. In other words, as shown in FIG. 4, in such a case that a ratio of the width of the stripe to the interval of the stripe is equal to 1:16, the pulse sequences are repeatedly performed 16 times in total.

Next, each of the measured echoes is processed by the inverse Fourier transform to form the projections 504 to 506. These projections 504 to 506 are overlapped with each other, so that the projection 507 of the entire object under examination can be synthesized.

At this time, 1 (one) pixel of this projection is not equal to the minimum unit of the spatial resolution determined by the strength of the readout gradient magnetic field and the sampling time period, namely the interval 502 of the stripe, but equal to the width 501 of the stripe. The width 501 of the stripe is equal to the spatial resolution determined by the radio frequency magnetic field and the readout gradient magnetic field.

In the conventional method such as the spin echo method, the spatial resolution 502 determined by the strength of the readout gradient magnetic field and the sampling time period constitutes the spatial resolution of the image. As a consequence, in order to obtain the same spatial resolution as the projection 507, while the strength of the readout gradient magnetic filed is made strong according to the above-described formula (3), the spatial resolution 502 determined by the strength of the gradient magnetic field and the sampling time period must be made equal to the width 501 of the stripe.

In other words, as shown in FIG. 4, when the ratio of the width 501 of the stripe to the interval 502 of the stripe is 1:16, the strength of the gradient magnetic field of the conventional method must be made 16 time stronger than that of the inventive method.

Figure 5:
FIG. 5 is a diagram for representing a pulse sequence used to explain operations of the magnetic resonance image apparatus according to this embodiment mode 1.

Next, in FIG. 5, there is shown a pulse sequence used to explain operations of the magnetic resonance imaging apparatus according to this embodiment mode 1. Referring now to this drawing, a description will be made of a method for setting the spatial resolution of the image in the readout direction of the spatial resolution control unit 401 of the magnetic resonance imaging apparatus according to this embodiment mode 1.

In FIG. 5, symbol "RF" shows a radio frequency magnetic field, reference numeral 601 shows a spatial resolution control portion, reference numeral 602 indicates an RF pulse, reference numeral 603 represents an excitation gradient magnetic field pulse, reference numeral 604 indicates a 180-degree pulse, and reference numeral 605 represents a readout gradient magnetic field pulse. Also, reference numeral 606 indicates an echo, reference numeral 608 shows a gradient magnetic field strength control portion, and further symbols Gx, Gy, and Gz show, as explained above, the gradient magnetic fields along the respective x-axis, y-axis, and z-axis directions. The readout direction at this time is equal to the x direction.

The magnetization excited by a plurality of RF pulses 602 is inverted by the 180-degree pulse. Then, the inverted magnetization is rephased (phase-inverted) by the readout gradient magnetic field to produce an echo 606.

In this embodiment mode 1, since the excitation is carried out plural times by the excitation pulse 602, a plurality of echoes 606 are produced. In general, a total number of echoes 606 is equal to a total number of RF pulses 602 used in the excitation. Also, the first echo 606 corresponds to such an echo 606 which is produced by the finally irradiated RF pulse 602, whereas the last echo 606 corresponds to such an echo 606 which is produced by the firstly irradiated RF pulse 602.

Normally, the strength of the readout gradient magnetic field pulse 605 is made equal to the excitation gradient magnetic field pulse 603, and the application starting time of the readout gradient magnetic pulse 605 is adjusted in order that the center of the RF pulse 602 is made symmetrical to the center of the echo 606 with respect to the irradiation center of the 180-degree pulse in view of time. By taking such a measure, the respective echoes 606 become spin echoes which are not adversely influenced by the nonuniform static magnetic field.

From the correspondence relationship between the RF pulse 602 and the echo 606, the echo time of the respective echoes 606 is different from each other. The earlier the echo 606 is measured, the shorter the echo time becomes.

As a result, each of the echoes 606 owns different T2-enhancement degrees. The larger the T2-enhancement degrees of the subsequent echoes become, the smaller the echo strengths become. Other than that, although there is a small difference in the influences caused by the apparatus characteristic such as eddy current, the characteristics of the respective echoes are in principle identical to each other.

Figure 6:
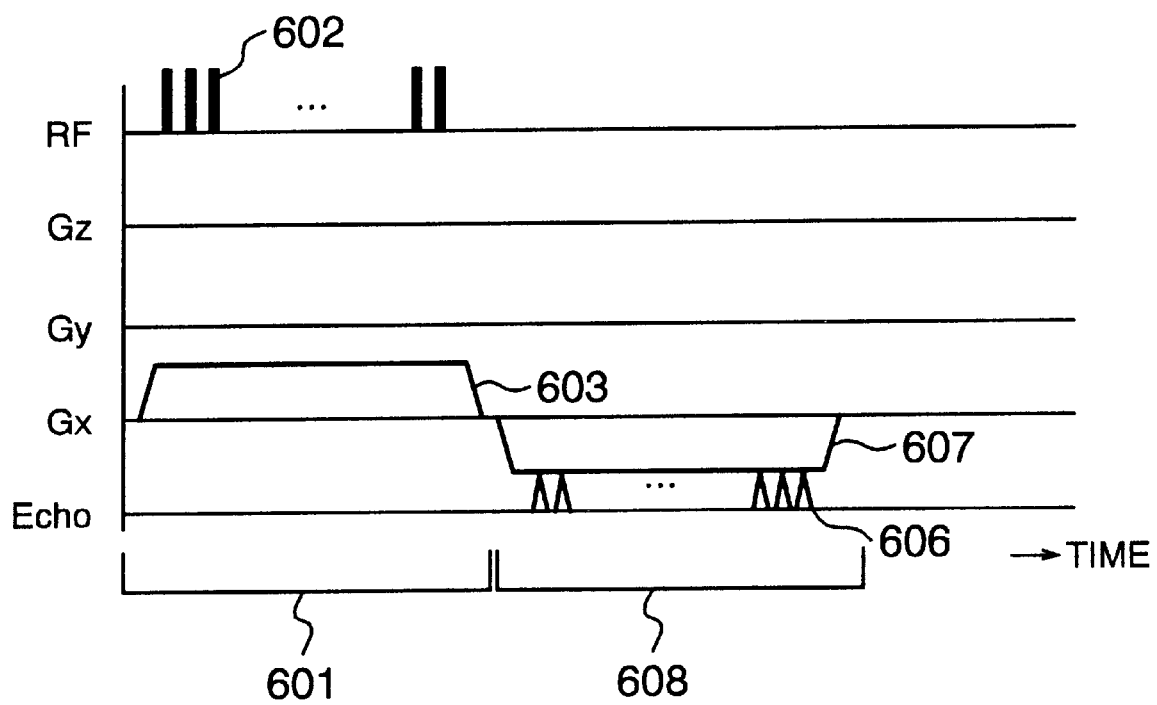
FIG. 6 is a diagram for showing a pulse sequence of a gradient echo method.

As shown in FIG. 6, echoes may be measured by employing the inverted readout gradient magnetic field 607 without irradiating the 180-degree pulse 604.

This echo is called as a "gradient echo". If the 180-degree pulse is employed, then it is possible to acquire such a spin echo which is not adversely influenced by the nonuniform static magnetic field. Since the 180-degree pulse is irradiated, the extra time of several ms is normally required.

However, since such a structure as shown in FIG. 6 is employed, the echo time of each echo can be shortened and the S/N ratio of the echo can be improved.

The spatial resolution control portion 601 is so arranged that a plurality of RF pulses 602 are irradiated while the excitation gradient magnetic field pulse 603 along the x direction is applied. This arrangement itself is the well known method which is described in JP-B-6-34784 more in detail.

Figure 7:
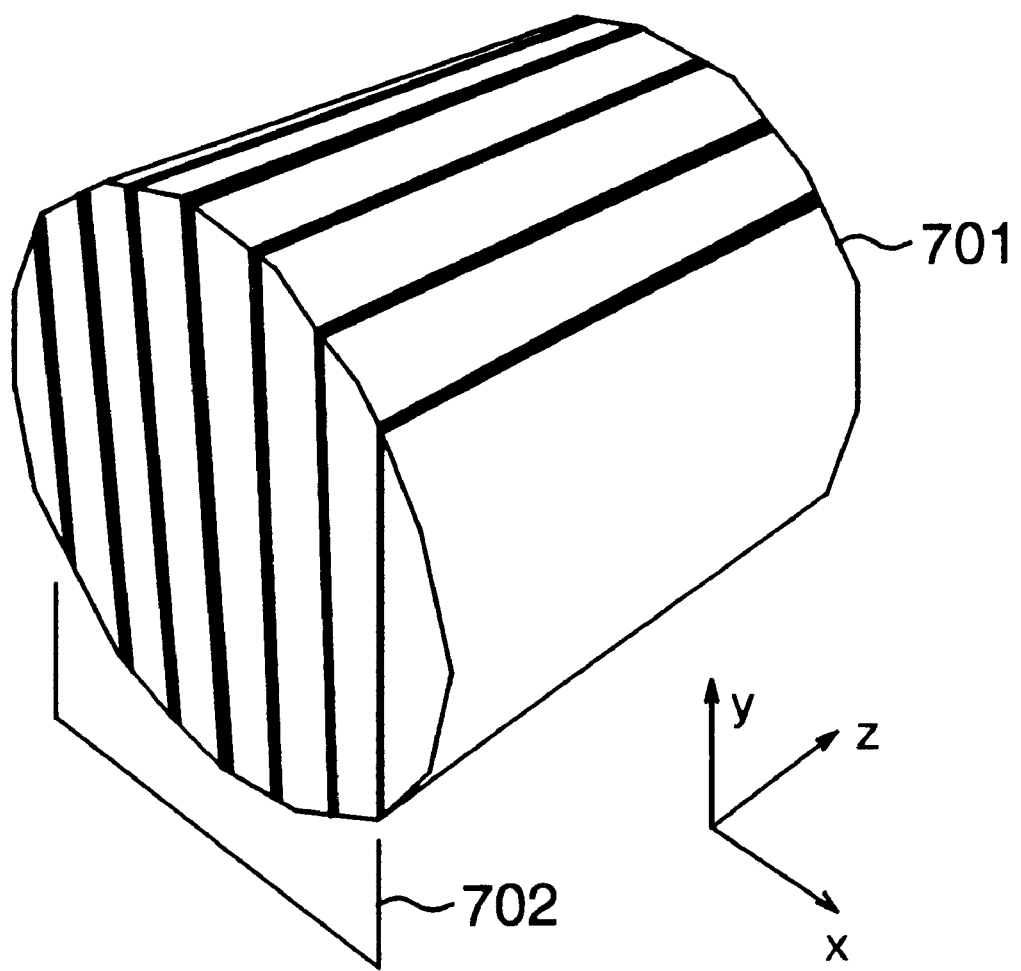
FIG. 7 is an illustration for explaining a condition of excitation occurred in a slice group.

As indicated by wide lines of FIG. 7, since the above-described magnetic fields 602 and 603 are applied to the object 103 under examination, the excitation region of an inside 701 of the object under examination becomes a slice group 702 perpendicular to the x direction.

It should be understood that the respective slices are positioned in an equi-interval and have the same thicknesses.

Figure 8:
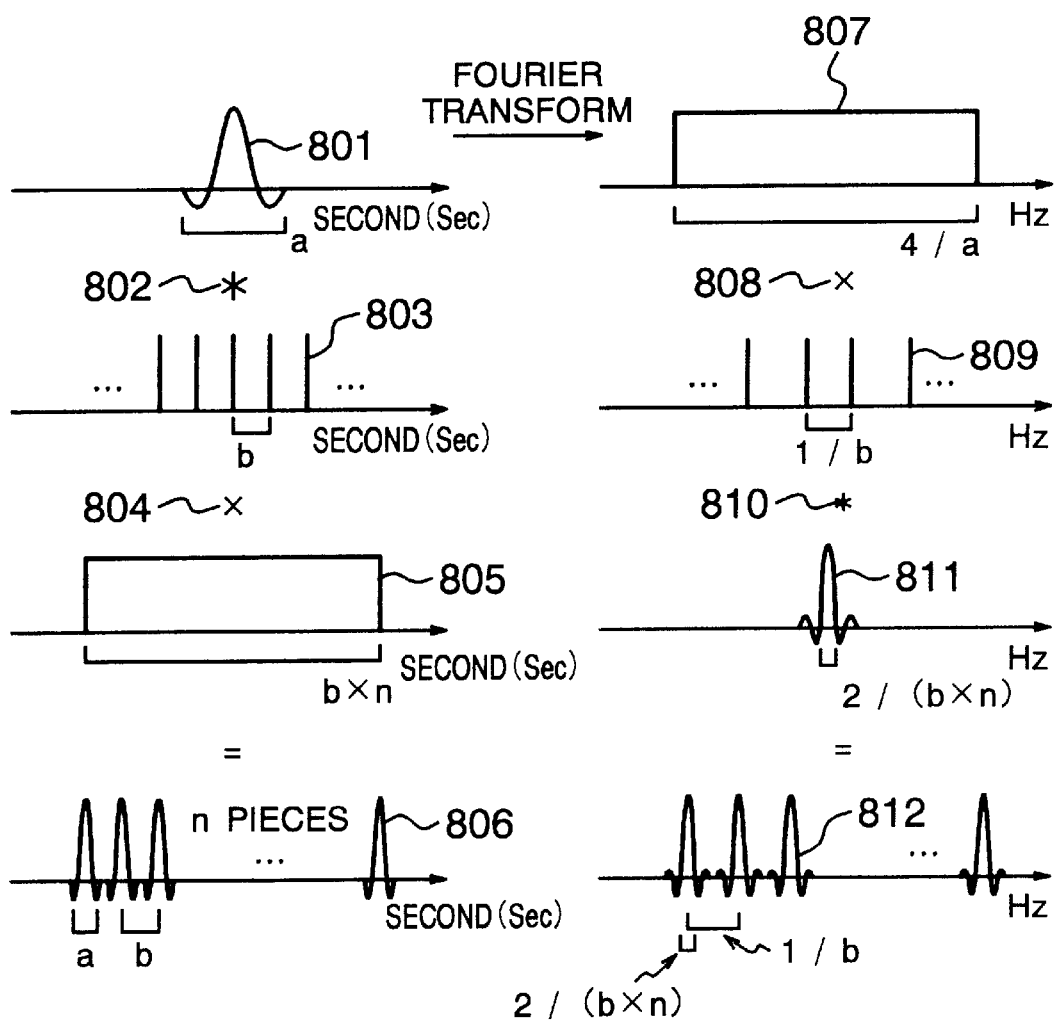
FIG. 8 is an illustration for explaining a basic idea about the occurrence of the slice group shown in FIG. 7.

Next, FIG. 8 shows an explanatory diagram for explaining an occurrence principle of the slice group indicated in FIG. 7. The occurrence principle of the slice group will now be described based upon this drawing.

In FIG. 8, when a waveform in a left column is Fourier-transformed, another waveform is obtained as shown in a right column. The left column indicates a shape of an RF pulse, and the right column shows a frequency distribution corresponding to this RF pulse. An ordinate of FIG. 8 indicates a strength, whereas an abscissa thereof represents time in the left column and a frequency in the right column.

Next, in the left column, with respect to a 3-peak waveform 801 of sinc function, a convolution calculation (*) 802 is carried out with a temporal-infinitive equi-interval pulse stream 803. Furthermore, when the convoluted result is multiplied by a rectangular wave 805 (product (×) 804), it becomes a temporal-finite 3-peak stream 806 of sinc function. The finite stream 806 corresponds to the pulse 602 of FIG. 5.

Assuming now that the width of the 3-peak waveform 801 of sinc function is "a", the interval of the pulse stream 803 is "b", and the width of the rectangular wave 805 is "b×n" ("n" being a positive integer)", the interval of the sinc function stream 806 becomes "b" and the application time of each of the sinc functions becomes "a".

When the Fourier transform is carried out with respect to each of the above-described waveforms, the Fourier-transformed waveform becomes the waveforms shown in the right column. The convolution calculation 802 is converted into a product 808, and the product 804 is converted into a convolution calculation 810.

Also, as apparent from FIG. 8, a frequency distribution in such a case that the RF pulse series 806 is projected becomes an equi-interval finite sinc function stream 812. It should be understood that the frequency band of the rectangular wave 807 is 4/a; the interval of the pulse stream 809 is 1/b; and the width of the main lobe of the sync function 811 becomes 2/(b×n). 2/(b×n) corresponds to 501 shown in FIG. 4, and 1/b corresponds to 502 shown in FIG. 4.

Also, if the side lobe of the sinc function 812 is neglected, then the frequency distribution may be conceived as a pulse stream having a width of 2/(b×n).

In the above-described explanation, the sinc function having the 3 peaks is employed as the RF pulse. Alternatively, such an optimized pulse that the shape of the sinc function whose peak number is increased is improved may be employed.

It should be understood that an "optimized pulse" implies such a pulse that a waveform of an RF pulse is optimized so as to reduce distortion of a rectangular waveform as low as possible in this specification.

Concretely speaking, for example, the waveform may be employed which is described in "S. Conolly et al., Optimal Control Solutions to the Magnetic Resonance Selective Excitation Problem IEEE Trans. on Medical Imaging, Vol. MI-5, No. 2, pages 106 to 115, in 1986". Since such an optimized pulse is used, the image shading phenomenon can be suppressed.

Assuming now that the number of the peaks of the sinc function is selected to be "s" (symbol "s" being a positive odd integer), the frequency band of the rectangular wave 807 becomes (s+1)/a. The larger "s" becomes, the smaller the distortion of the shape of the rectangular wave 807 is reduced. However, since the irradiation time "a" required to realize the same frequency band is prolonged, the free degree in the pulse interval "b" is lowered, "s" may be selected to be 3 under the normal imaging operation.

However, since the distortion in the rectangular wave 807 constitutes the shading phenomenon of the image, when the deterioration in the image quality is large, the total number of peaks may be increased, or the optimized pulse may be employed.

In such a case that a gradient of a resonance frequency is produced within the object under examination while a gradient magnetic field is applied when the RF pulse series 806 is irradiated, the excitation region within the object under examination becomes such a slice group having an equi-interval and located perpendicular to the direction along which the gradient magnetic field is applied as shown in FIG. 7.

When this excitation condition is represented as a projection image, this projection image is indicated in FIG. 4. The thickness 501 of the slice is 2/(b×n), and the interval 502 of the slice is 1/b. Assuming now that the gradient magnetic strength is selected to be "Gx", the thickness W of the excitation region along the readout direction is given by the below-mentioned formula (4):

$$W=(s+1)/a(\gamma \times Gx) \qquad (4)$$

Also, the spatial resolution along the readout direction, namely the thickness "d" of the slice is given by the following formula (5):

$$d=2/(b \times n)/(\gamma \times Gx) \qquad (5)$$

where the interval 502 of the slice becomes 1/b/(γ×Gx).

While the echo is measured, the spatial resolution ΔWx determined by the readout gradient magnetic field strength and the sampling time period is made equal to the interval 502 of this slice, and is defined by the following formula (6):

$$\Delta Wx=1/b/(\gamma \times Gx) \qquad (6)$$

In this case, when the relationship defined by the formula (1) is employed, a relationship among the interval "b" of the RF pulse, the sampling rate "Δt", and the sampling point number "N" is given as follows:

$$b=\Delta t \times N \qquad (7)$$

A flip angle of each of the RF pulses is selected to be approximately 90/n degrees, and an entire flip angle of the RF pulses becomes 90 degrees in the same manner to the spin echo method. In such a case that the same slice is excited without waiting for sufficient repeating time, if the entire flip angle of the RF pulses is made smaller than 90 degrees, then the signal attenuation occurred after the second RF pulse is lowered, so that the S/N ratio of the echo may be increased.

In order to image the entire object under examination without dropping images, the echoes must be repeatedly measured while changing the position of the slice group. The position of the slice group may be shifted by varying the frequency of the carrier wave used when the RF pulse series is irradiated.

For example, in the case that such a slice located adjacent to the previously excited slice is excited, the carrier frequency may be changed by such a frequency of 2/(b×n) corresponding to the thickness of the slice.

Figure 9:
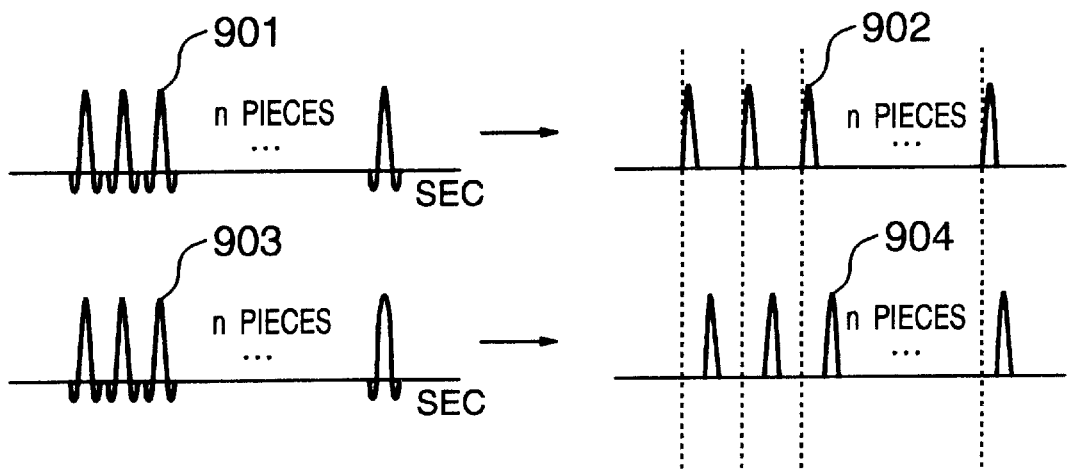
FIG. 9 is an illustration for explaining movement of the slice indicated in FIG. 8.

In other words, as indicated in FIG. 9, assuming now that the carrier frequency of the RF pulse series 901 is "$f_0$" and an excitation profile (corresponding to projection 503) caused by this RF pulse series is 902, when the carrier frequency of the RF pulse series 903 is selected to be $f_0$+2/(b×n), an excitation profile 904 is shifted by 2/(b×n) with respect to the excitation profile 902.

Since the slice interval 502 is 1/b at this time, while the frequency of the carrier wave is varied every 2/(b×n), if the echo measurement is repeatedly performed n/2 times in total, then all of the information along the readout direction may be acquired.

As another method of shifting a position of a slice, there is a method of changing a strength of a static magnetic field.

This is realized by the shim power supply 113 controlled by the sequencer 104 shown in FIG. 1, and also the shim coil 112 connected to this shim power supply 113.

Assuming now that the gyromagnetic ratio of the nucleus (normally, proton) to be examined is "γ", there is such a relationship defined by the below-mentioned formula (8) between a change ΔH of the static magnetic field strength and a change Δf of the resonance frequency:

$$\Delta f = \gamma \times \Delta H \quad (8)$$

As a result, when the current supplied to the shim coil 112 is changed and also the static magnetic field strength is changed only by such a ΔH capable of satisfying the below-mentioned formula (9), the position of the slice can be shifted only by a thickness of a single slice:

$$\gamma \times \Delta H = 2/(b \times n) \quad (9)$$

As a result, the peak of 812 shown in FIG. 8 is shifted by 1 pulse.

The above-described two methods capable of shifting the slice position may be applied to the respective embodiments of the present invention.

Figure 10:
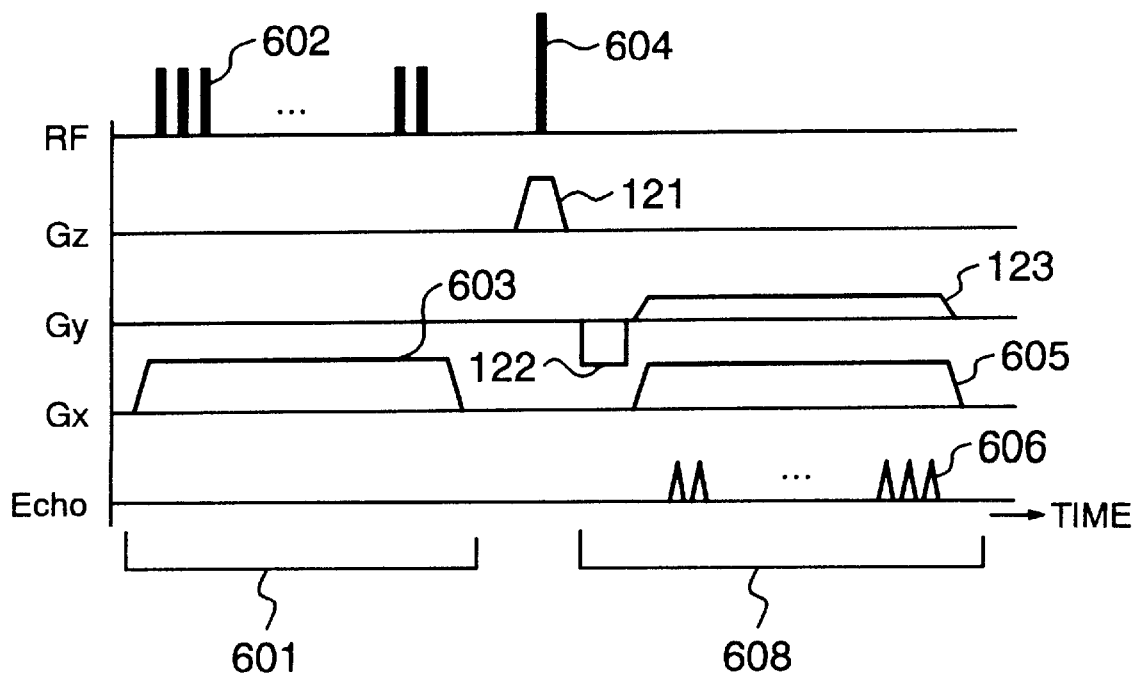
FIG. 10 is a diagram for representing an example of a pulse sequence used to image a two-dimensional image.

Next, in FIG. 10, there is shown an example of a pulse sequence used to image a two-dimensional image. Based upon this drawing, a description will now be made of a method for imaging a two-dimensional image by using the above-described spatial resolution control method.

This example is such a pulse sequence that the Fourier transform method is used to reconstruct an image. This pulse sequence is constituted by adding to the pulse sequence shown in FIG. 4, each of a dephase gradient magnetic field pulse 122 and a phase encode gradient magnetic field pulse 123 for giving positional information along the y direction to the magnetization, and a slice selective gradient magnetic field pulse 121 for giving positional information along the z direction to the magnetization.

Since the slice selective gradient magnetic filed pulse 121 is applied at the same time when the 180-degree pulse 604 is applied, only the magnetization of a portion along the z-axis direction is selectively inverted, and thus a slice located perpendicular to the z axis is determined. Only this inverted magnetization is rephased by the readout gradient magnetic field pulse 605, so that the echo 606 is obtained.

As a consequence, information about only a specific slice along the z direction may be obtained. Both the position and the slice at this time may be freely controlled based upon the frequency of the carrier wave of the 180-degree pulse 604 and the strength of the slice selective gradient magnetic pulse 121.

For instance, in the case that the waveform of the 180-degree pulse 604 is "m" peaks of sinc function, both a position "z" of a slice and a thickness "Δz" of this slice are given by the below-mentioned formulae (10) and (11):

$$z = (f - f_0)/(\gamma \times Gz) \quad (10)$$

$$\Delta z = (m+1)/(\gamma \times Gz \times t) \quad (11)$$

It should be noted that symbol "f" indicates a carrier frequency, symbol "$f_0$" represents a resonance frequency, symbol "γ" denotes a gyromagnetic ratio, symbol "Gz" shows a strength of a slice selective gradient magnetic field pulse, and symbol "t" indicates projection time of a 180-degree pulse.

Figure 11:
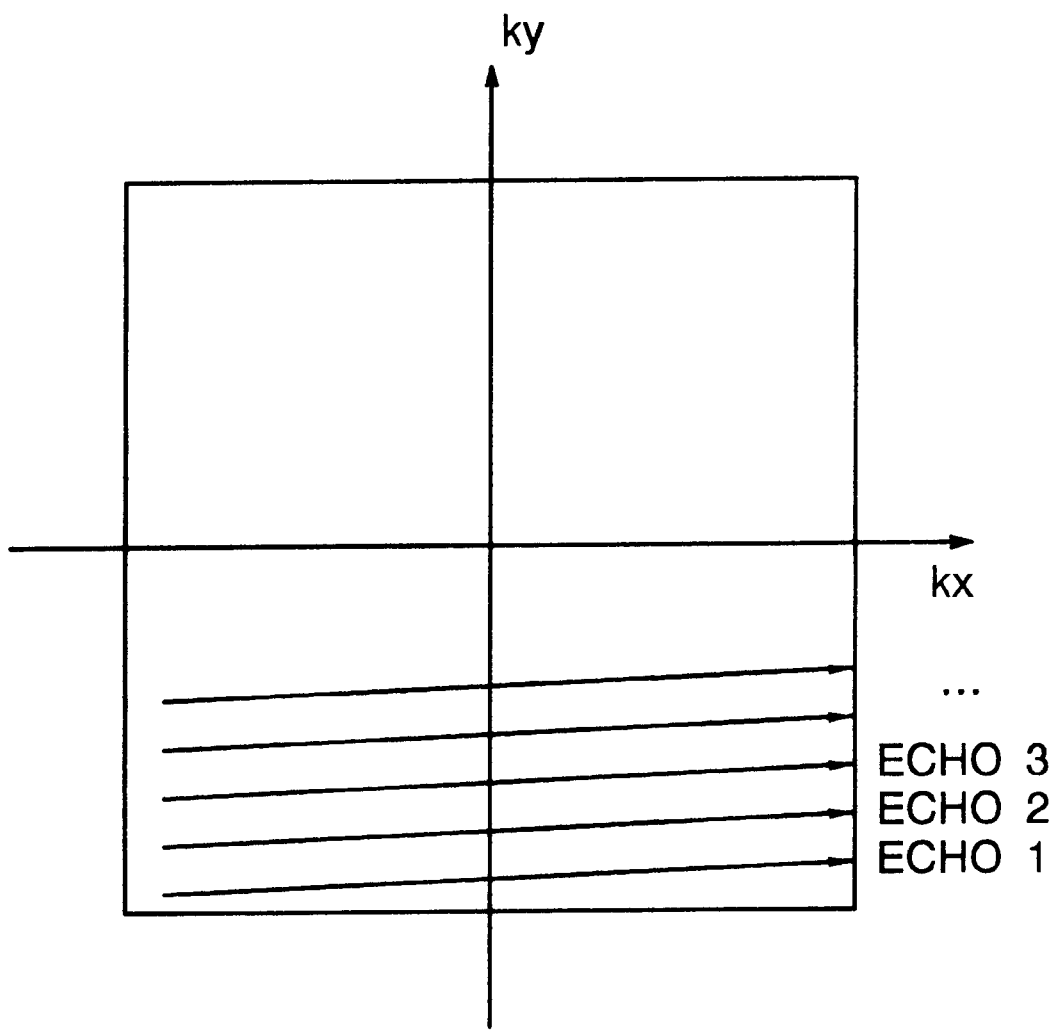
FIG. 11 is an illustration for explaining a condition of a measuring space.

Since the dephase gradient magnetic field pulse 122 and the phase encode gradient magnetic field pulse 123 are applied, the positional information along the y direction is applied to the magnetization and the echoes scan a k space (measuring space) as shown in FIG. 11. In other words, a first echo is positioned along the minus direction of the ky axis by the dephase gradient magnetic field pulse 122, and is moved along the plus direction thereof every echo by the rephase by the phase encode gradient magnetic field pulse 123.

Also, since the phase encode gradient magnetic field pulse 123 is continuously applied, the echoes scan the k space along the oblique direction. At the time when the dephase gradient magnetic field pulse 122 is cancelled by the phase encode gradient magnetic field pulse 123, the echoes intersects with an kx axis. It should be noted that instead of the phase encode gradient magnetic field pulse 123, even when this pulse is inverted and the inverted pulse is applied together with irradiation of the RF pulse 602, the same effect as the same phase encode may be achieved.

A visual field "Wy" along the y direction is determined by the strength "Gy" of the phase encode gradient magnetic field pulse 122 and the echo interval "b", and is given by the following formula (12):

$$Wy = 1/(\gamma \times Gy \times b) \quad (12)$$

Also, the spatial resolution "Δy" along the y direction depends upon such a fact, i.e., how wide the echoes scan "ky". For example, in the case that "ny" pieces of echoes are measured in such a manner that the measurement becomes symmetrical with respect to the kx axis, the spatial resolution Δy is defined by the following formula (13):

$$\Delta y = Wy/ny \quad (13)$$

Also, in such a case that while 4 echoes are arranged on one side and 16 echoes are arranged on the other side with respect to the kx axis, the half Fourier transform is carried out so as to produce an image equivalent to 32 echoes, the spatial resolution Δy is defined by the below-mentioned formula (14):

$$\Delta y = Wy/32 \quad (14)$$

To image the overall image of the object 103 under examination, while the position of the slice group is changed the pulse sequence is repeatedly executed in a similar manner to the above-described manner. In other words, when the measurement is repeatedly executed n/2 times in total, all information along the readout direction may be acquired. As a result, n/2 pieces of two-dimensional echo sets may be obtained as shown in FIG. 11.

Figure 12:
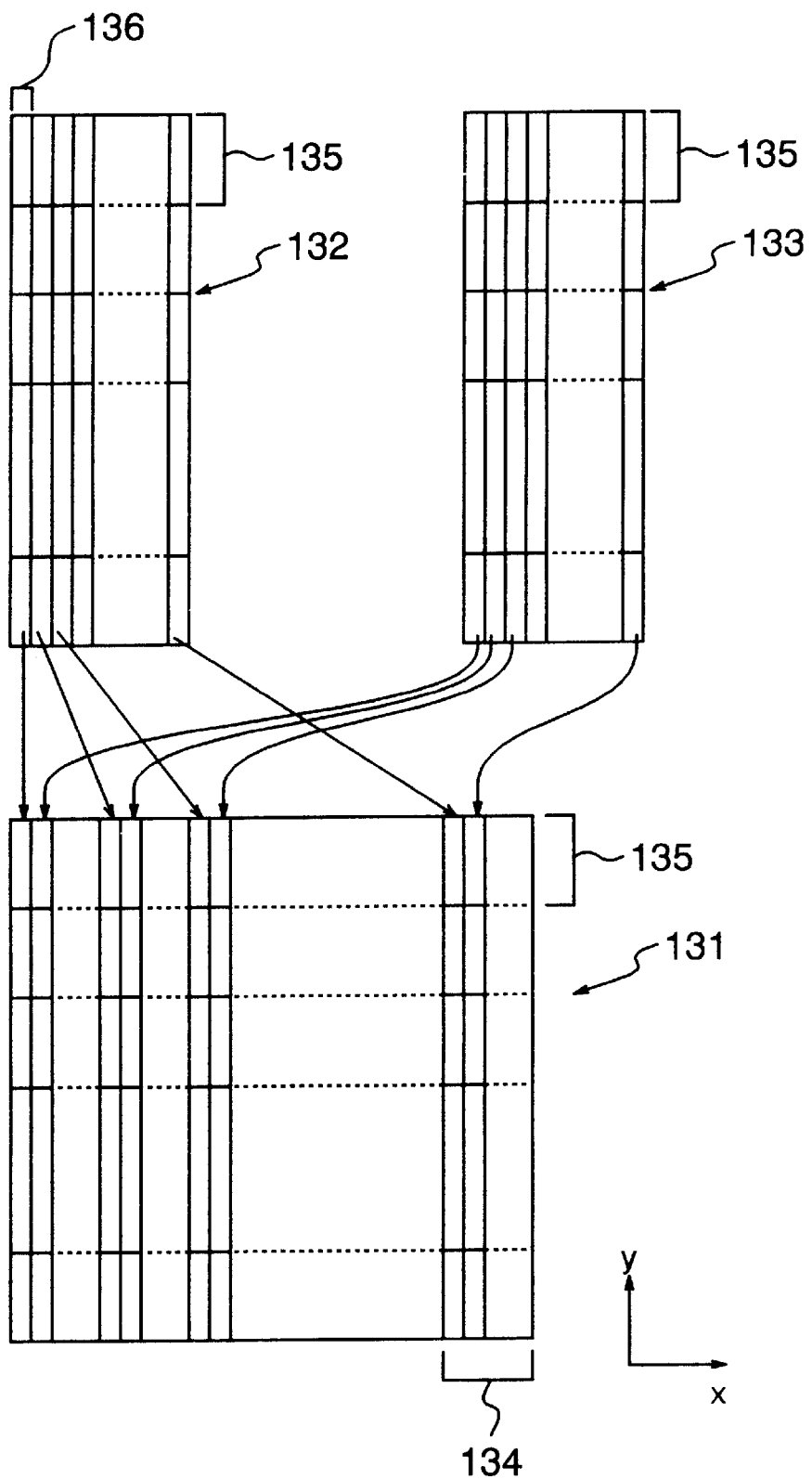
FIG. 12 is a diagram for describing a method for reconstructing an image from a two-dimensional echo set.

Next, FIG. 12 indicates an explanatory diagram for explaining a method for reconstructing an image from a two-dimensional echo set. The image reconstructing method will now be described with reference to this drawing.

An image reconstruction is carried out by 2-dimensional-inverse-Fourier transforming a 2-dimensional echo set acquired in each measurement and thereafter by composing the transformed echo sets.

In FIG. 12, reference numeral 131 shows either a visual field or a reconstructing image; reference numerals 132 and 133 show partial images produced by 2-dimensional inverse Fourier transforming echo sets acquired during a first measuring operation (504 shown in FIG. 4), and a second measuring operation (505 shown in FIG. 4) respectively; and reference numerals 134 and 135 represent widths of 1 pixels which are determined by the readout gradient magnetic field and the phose encode gradient magnetic field respectively. Reference numeral 136 indicates a width of 1 pixel of a reconstructed image along the readout direction. It should also be noted that the width of 1 pixel of the reconstructed image along the phase encode direction is 135.

First, the echo set acquired during the first measuring operation is 2-dimensional inverse Fourier transferred to thereby produce the partial image 132. The respective columns of the partial image 132 are arranged to the corresponding columns of the reconstructed image. Similarly, the echo sets acquired on and after the second measuring operation are arranged on the reconstructed image. When this process operation is carried out unit n/2 pieces of echo sets, the image reconstruction operation is accomplished.

Since the echoes scan the k space along the oblique direction, when the fast Fourier transform is applied, the coordinate conversion is required. Even when this fast Fourier transform is directly applied, the image may be reconstructed. However, low distortion will occur.

As a result, since the echoes can scan the k space along the horizontal direction by applying the phase encode gradient magnetic field pulse among the respective echoes in a blip shape, the fast Fourier transform can be directly applied.

It should also be noted that since there is no temporal space among the echoes at this time, both ends of these echoes must be more or less cancelled.

When the image acquired in the above-described sequential operation is represented on the display 110, this image is normally displayed after all of the image reconstruction process operations are completed. Alternatively, the partial images acquired every time the pulse sequence is repeatedly performed may be displayed at each time instant when each of these partial images is obtained. In the latter case, since both a highspeed signal processing system and a highspeed display system are employed, the resolution of the displayed images can be gradually increased every time the pulse sequence is repeatedly performed.

In the case that the object under examination is deviated from the visual field, aliasing will be produced in the image. It should be understood that since the width of the excitation region can be adjusted by the RF pulse along the readout direction, this aliasing problem can be avoided by making this width narrower than the visual field.

Otherwise, the sampling rate is made lower than the value determined by the above-explained method, and further a total number of sampling point is increased based upon the reduced sampling rate so as to make the echo measuring time constant. Under such a condition, the echoes are measured, so that the visual field may be increased. Normally, the sampling point is increased twice, and the sampling rate is decreased by ½.

On the other hand, since the visual field cannot be enlarged along the phase encode direction by selecting the region by using the excitation pulse, or by increasing the echo number, a region selecting pulse sequence is carried out prior to the imaging operation.

Figure 13:
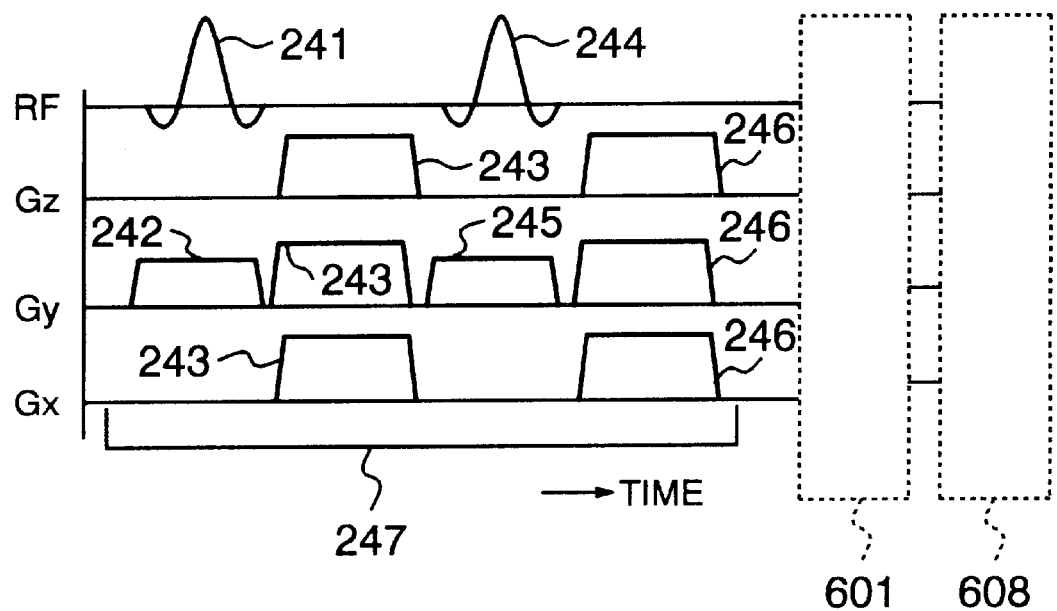
FIG. 13 is a diagram for explaining another pulse sequence according to the present invention.

This region selecting pulse sequence is indicated in FIG. 13. A relationship between the object under examination and the visual field is shown in FIG. 14.

Figure 14:
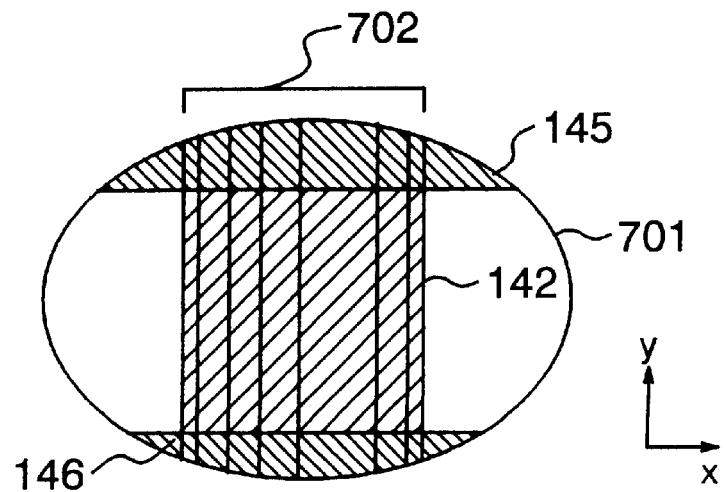
FIG. 14 is an illustration for explaining a relationship between an object under examination and a visual field in the pulse sequence shown in FIG. 13.

In FIG. 14, symbol "x" indicates a readout direction, and symbol "y" shows a phase encode direction.

In a region selection portion 247, only an outside region 145 of a visual field 142 along the y direction is firstly excited by the RF pulse 241 and the gradient magnetic field pulse 242, and this outside region 145 is saturated by a crasher gradient magnetic field pulse 243 so as to be brought into such a condition that no signal is produced.

Subsequently, only another outside region 146 of the visual field 142 along the y direction is excited by using both the RF pulse 244 and the gradient magnetic field pulse 245 in a similar manner. Then, this outside region 146 is saturated by using a crasher pulse 246 so as to be brought into such a condition that no signal is produced.

It should also be noted that a region which is desirably saturated may be arbitrarily selected by changing the carrier frequency of the RF pulse. In particular, in such a case that the region which is wanted to be saturated is symmetrically wanted with respect to an origin of the gradient magnetic field, the polarities of the gradient magnetic field pulses 242 and 245 may be inverted while the carrier frequency is made constant.

In the pulse sequence shown in FIG. 13, the excitation operations are carried out two times. Alternatively, the region outside the visual field may be saturated by executing the single excitation and also by applying the crasher gradient magnetic field pulse with employment of such an RF pulse by which the excitation profile becomes only the outside regions 145 and 146.

The waveform of such an RF pulse may be produced by inverse-Fourier-transferring the excitation profile in accordance with the simplest manner.

Since the outside regions 145 and 146 outside the visual field are brought into such a condition that no signal is produced in accordance with the above-described method, the region which can be excited along the phase encode direction can be limited only to the range of the visual field. As a result, since the imaging operation is commenced just after the above-described process operation, the aliasing problem can be solved.

Figure 15:
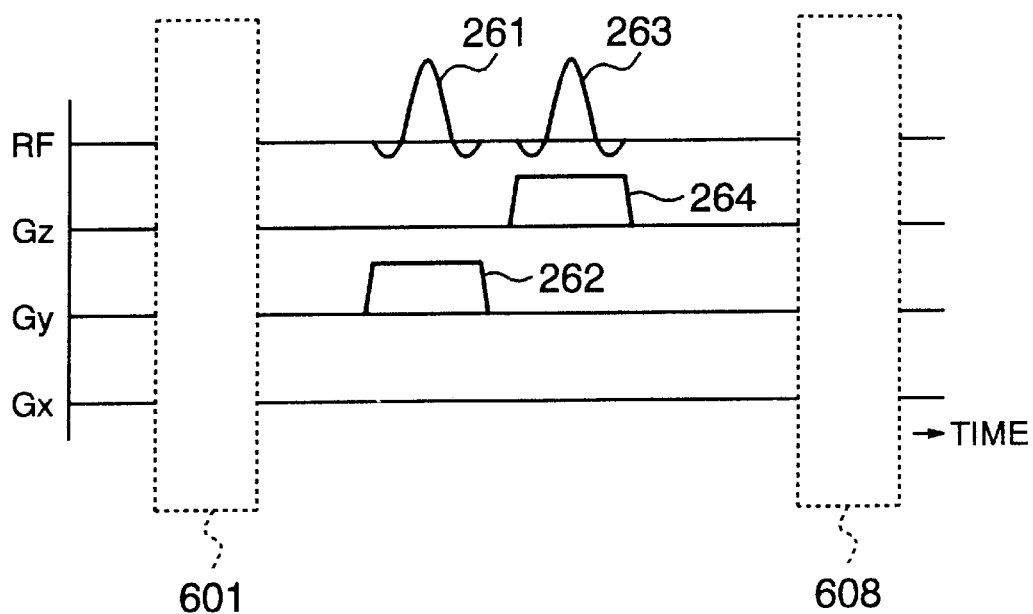
FIG. 15 is a diagram for explaining another pulse sequence according to the present invention.

Also, as another method for selecting the region along the phase encode direction, there is such a method for using two sets of 180-degrees pulses 261 and 263 (see FIG. 15) between the pulse sequences 601 and 608 of FIG. 10 instead of the region selection along the z direction with employment of the 180-degree pulse 604 and the gradient magnetic field pulse 121 of FIG. 10. In this alternative method, the range of the visual field along the phase encode direction is first selected by using the 180-degree pulse 261 and the gradient magnetic field 262. Next, a selection of a slice direction is carried out by employing both the 180-degree pulse 263 and the gradient magnetic field pulse 264 along the z direction.

Alternatively, it is also possible to employ such a method for selecting a z-dimensional region by way of a single RF pulse. A detailed content of this alternative method is referred to the publication "C. J. Hardy and H. E. Cline, "Spatial Localization in Two Dimensions Using NMR Designer Pulses", Journal of Magnetic Resonance vol.82, pages 647 to 654 in 1989.

In the pulse sequence shown in FIG. 10, both the spatial resolution along the y direction and the pixel number are restricted by the number of echoes. As a result, in the case that the number of echoes becomes shortage, it is possible to employ the k-space subdivision measuring method for subdividing the measurement into plural sub-measurements so as to increase the number of echoes. This method is performed as follows. That is, the k space is subdivided in an ky direction, and the measurement is carried out as plural measurements.

Figure 16:
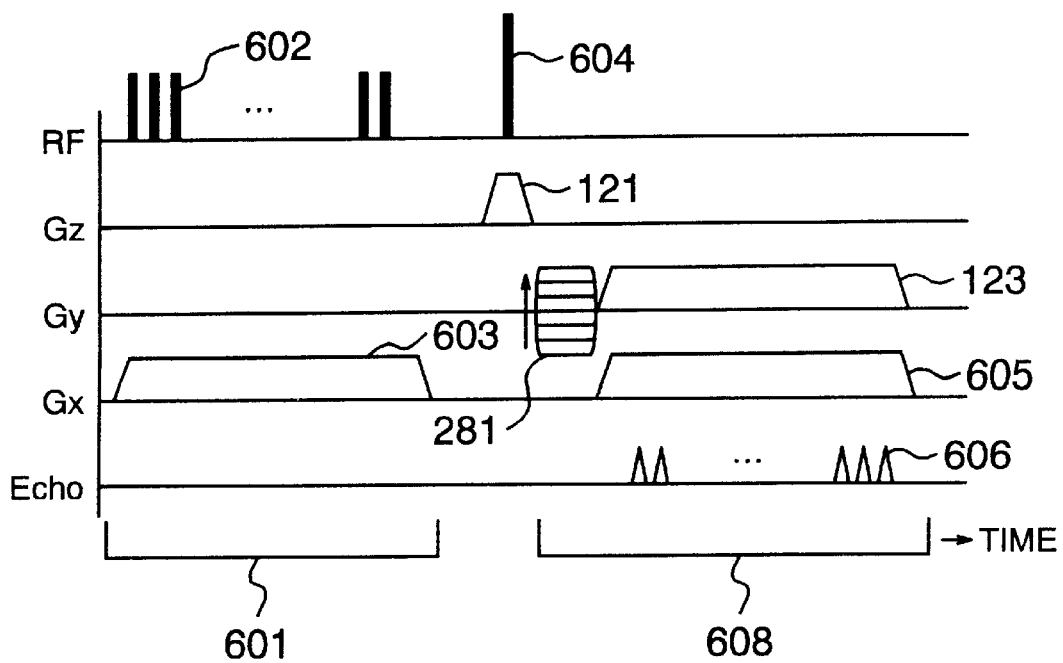
FIG. 16 is a diagram for explaining another pulse sequence according to the present invention.
Figure 17:
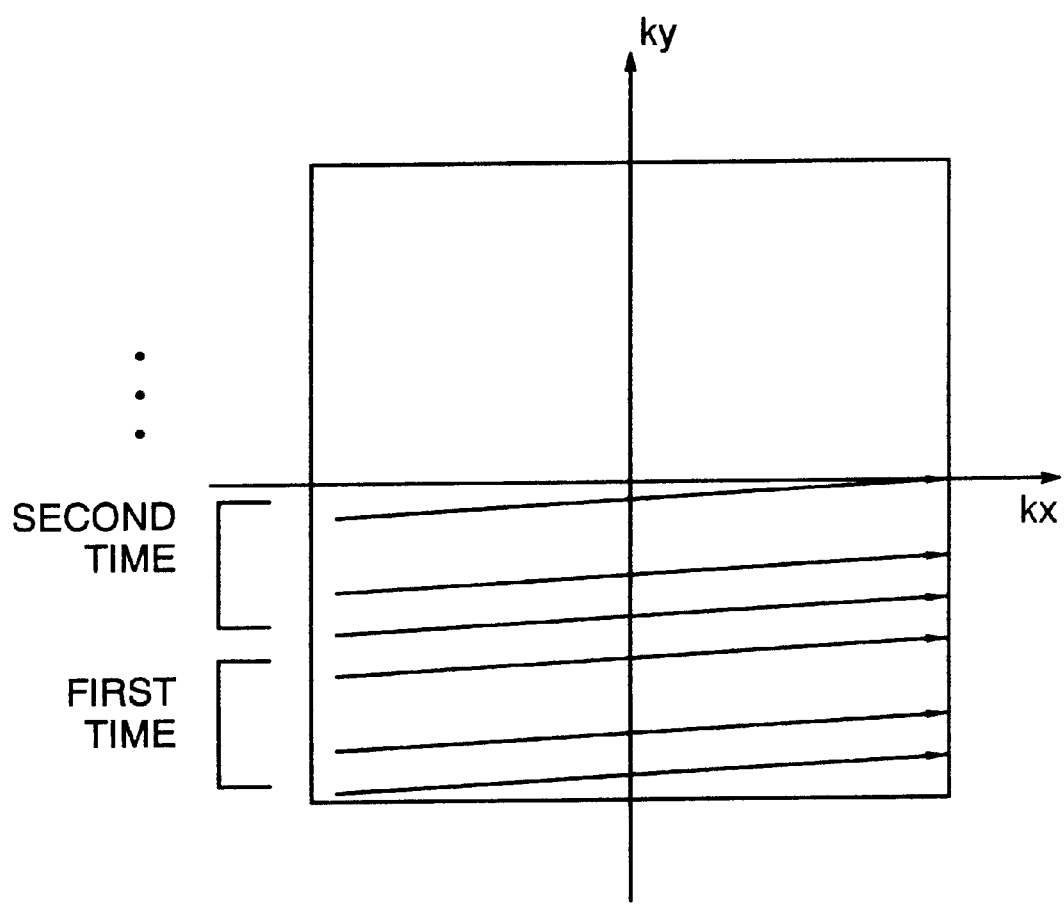
FIG. 17 is a diagram for explaining a method for scanning a measuring space in the pulse sequence shown in FIG. 16.
Figure 18:
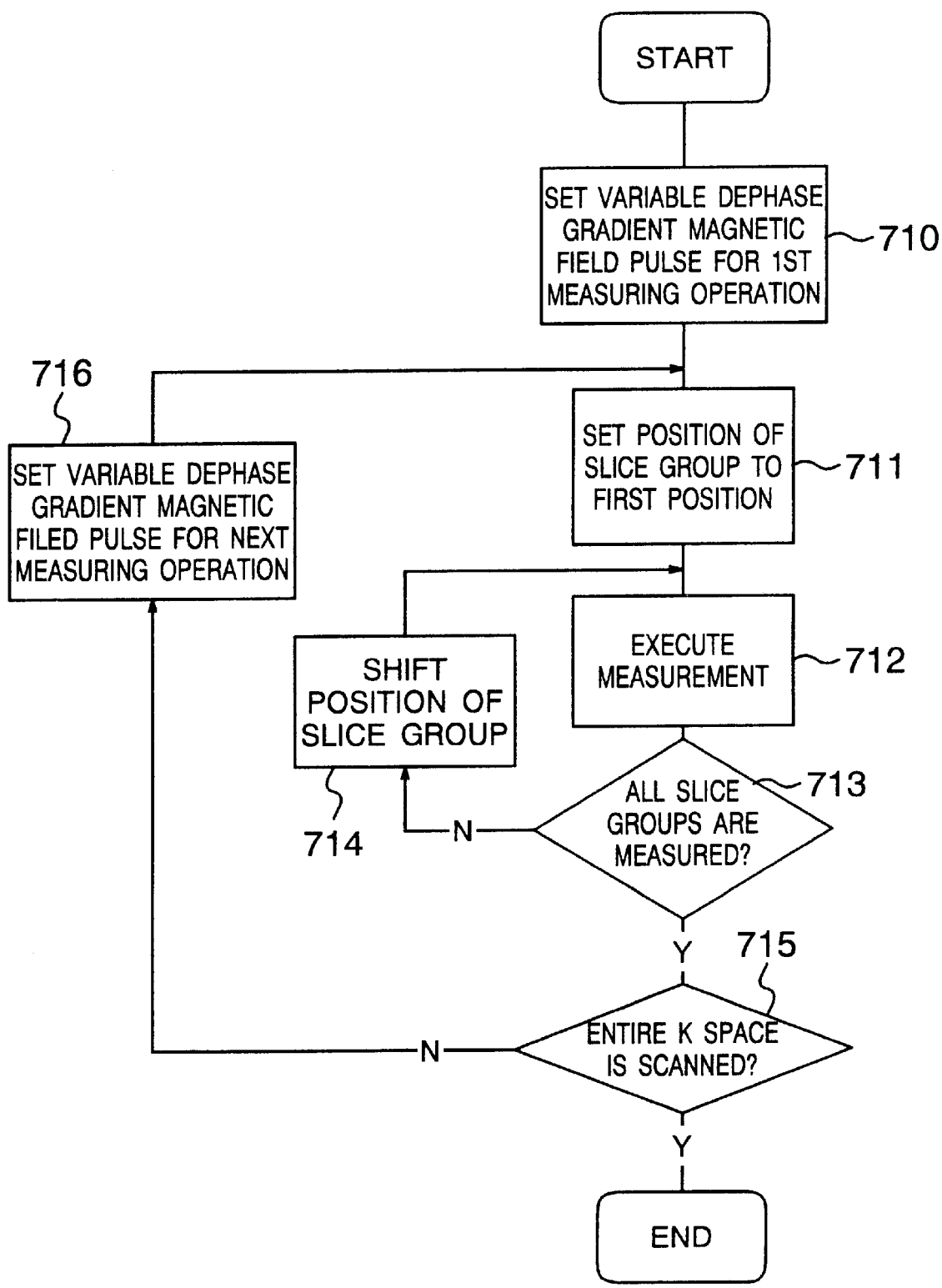
FIG. 18 is a flow chart for describing a measurement executed by the pulse sequence shown in FIG. 16.

A pulse sequence of this k-space subdivision measuring method is shown in FIG. 16, a scanning method of a k space is illustrated in FIG. 17. Also, a flow chart of this measuring method is shown in FIG. 18.

The pulse sequence in this case employs a variable dephase gradient magnetic field pulse 281 instead of the dephase gradient magnetic field pulse 122 of the pulse sequence shown in FIG. 10.

First of all, as shown in FIG. 17, this variable dephase gradient magnetic field pulse 281 is set in such a manner that the scanning position on the k space is located at the lowmost position (710), and a first measurement is carried out. It should also be noted that while the position of the slice group is shifted (moved), the sequence is repeatedly performed in this measurement.

In other words, first of all, the position of the slice group is set to a first arbitrary position (711) and then a measurement is carried out (712). Next, the measurement is repeatedly performed while the position of the slice group is shifted (714) until all of the slice groups have been completely measured (713). Subsequently, the variable dephase gradient magnetic field pulse 281 is set in such a manner that the scanning position becomes the starting position in each of the measurements (716), and the measurement is repeatedly performed only by the necessary times in a similar manner (715).

Next, a description will now be made of concrete parameters of a pulse sequence used to image such an image having spatial resolution of 50 μm along the readout direction in such an example case that the magnetic resonance imaging apparatus according to the present invention is applied to a microscopy capable of extracting a very fine structure of an object under examination.

In this example, it is assumed that a sinc function having 3 peaks is employed as the RF pulse in the pulse sequence indicated in FIG. 10.

Assuming now that a thickness of an excitation region is used as a visual field, i.e., Wx=25.6 mm; and the strength of the excitation gradient magnetic field pulse 603 is made equal to the strength of the readout gradient magnetic field pulse 605, i.e., Gx=30 mT/m, the irradiation time of a single RF pulse becomes a=122.331 μsec.

Since the resolution is equal to 50 μm, the overall application time (b×n) of 602 is calculated by the formula (5) to obtain 2/d/(γ+Gx)=31.3166 ms. When the number "n" of the RF pulses is selected to be 64, b=489.322 μsec.

Also, the slice interval of 1/b/(γ×Gx) becomes equal to the spatial resolution ΔWx determined by the strength of the readout gradient magnetic pulse and the sampling time period, namely 1.6 mm. A total number of slices within the visual field is equal to 16.

Also, assuming now that the thickness along the z direction is selected to be 2 mm, the shape of the 180-degree pulse is the sinc function having the 3 peaks, and also the projection time is selected to be 2 ms, the strength Gz of the slice selective gradient magnetic field pulse is given as 4/(γ×t×Δz)=23.487 mT/m.

The sampling point number N is equal to Wx/ΔWx=16, and the sampling rate Δt is given as b/N=30.5826 μs.

Since 64 pieces of RF pulses are projected in this embodiment, 64 pieces of echoes are measured. It is now assumed that the entire information along the y direction may be acquired based on these 64 echoes, and the total pixel number along the y direction is equal to 64.

Assuming now that the visual field Wy along the y direction is made equal to Wx, namely 25.6 mm, the spatial resolution along the y direction becomes Wy/64=400 μm. At this time, the strength Gy of the phase encode gradient magnetic field pulse becomes 1/(γ×b×Wy)=1.875 mT/m.

The flip angle of the RF pulse is equal to 90 degrees/64= 1.4 degrees. Since the excitation time and the echo measuring time are approximately 31 ms, respectively, and further the irradiation time of the 180-degree pulse is 2 ms, a time period defined from the commencement of the excitation until the end of the echo measurement is equal to approximately 70 ms even if the rising time of other gradient magnetic pulse is involved.

While the position of the slice is shifted by way of any one of the previously explained methods for acquiring the overall information about the object under examination, the above-explained measurement is repeatedly performed.

It should also be noted that since the slice interval is 1.6 mm and the slice thickness is 50 μm, a total repetition number of the above-described measurement becomes 32.

Also, the shift amount is made equal to the slice thickness, namely 50 μm. This shift amount becomes 2/(b×n)=63.8638 Hz under the carrier frequency of the RF pulse. Since the different regions are excited every time the measurement is repeated, the waiting time for the recovery of magnetization is no longer required when the measurement is repeatedly performed. As a consequence, the overall measuring time becomes approximately 70 ms×32=2.24 s.

Since the above-explained measurement is carried out, such an image can be acquired within very highspeed imaging time of 2.24 s, namely the visual field of 25.6 mm×25.6 mm; the spatial resolution of 50 μm×400 μm; and the pixel number of 256×64.

As previously explained, since the echoes can be measured by the magnetic resonance imaging apparatus of this embodiment mode 1 while using a low strength of the gradient magnetic field such as Gx=30 mT/m, it is possible to realize the microscopy with respect to the human body, which could not be conventionally realized.

In other words, in order that the image having the same spatial resolution is imaged by employing the conventional Spin-Echo method, the gradient magnetic field having the strength 16 times higher than that of the gradient magnetic field in the inventive imaging apparatus, namely 480 mT/m is required along the readout direction. As a result, it could not be realized in the apparatus having the large bore diameter directed to the human body.

Also, in accordance with the apparatus safety standards by FDA (Food and Drug Administration in USA), the time change ratio dB/dt of the magnetic field of the pulse having the application time longer than, or equal to 120 μs is selected to be 20 T/s.

As a consequence, when the gradient magnetic field of 480 mT/m is produced, for example, a magnetic field strength at a position separated from an origin by 20 cm becomes 96 mT. When this magnetic field is produced in accordance with the apparatus safety standard, such lengthy time as 4.8 ms is required. There are such problems that signals are attenuated and imaging time is prolonged due to this waiting time.

As previously explained, to the contrary, in the magnetic resonance imaging apparatus of this embodiment mode 1, since the strong magnetic field is not required, the microscopy can be performed with respect to the human body.

Nowadays, there is no effective imaging method in a microscopy for a human body. As a consequence, a very fine structure of an inner ear is merely drawn, and joints of a shoulder, an elbow, and a knee in an orthopaedic surgery field are simply imaged for research purposes.

However, in accordance with the imaging apparatus of the embodiment mode 1, the clinic MRI apparatus may be applied to these application fields. Also, since the very fine structure of the object under examination can be drawn, the imaging apparatus of this embodiment mode 1 may be utilized as the diagnostic apparatus for mammography and osteoporosis, in which X-ray diagnoses are carried out. Since the imaging apparatus according to the present invention employs magnetic resonance, there is no risk in the X-ray exposures and also no side effect to the human body. Therefore, there is a merit that the diagnose can be readily performed.

Next, concrete parameters for such a pulse sequence as to a method for imaging an image in a high speed under very low readout gradient magnetic field will now be explained while the imaging apparatus of this embodiment mode 1 is applied to the normal spatial resolution imaging operation. It should be noted that the pulse sequence is the same as in FIG. 10.

In this case, the spatial resolution along the readout direction is selected to be 1 mm, and the sinc function having the 3 peaks is employed as the RF pulse.

Assuming now that a thickness of an excitation region is used as a visual field, i.e., Wx=256 mm; and the strength of the excitation gradient magnetic field pulse is made equal to the strength of the readout gradient magnetic field pulse, i.e., Gx=3 mT/m, the projection time of a single RF pulse becomes a=122.331 μsec.

Since the resolution is equal to 1 mm, the overall application time (b×n) of the pulse 602 is calculated to obtain 2/d/(γ+Gx)=15.6583 ms. When the number "n" of the RF pulses is selected to be 64, b=244.661 μsec.

Also, the slice interval of 1/b/(γ×Gx) becomes equal to the spatial resolution ΔWx determined by the strength of the readout gradient magnetic pulse and the sampling time period, namely 32 mm. A total number of slices within the visual field is equal to 8.

Also, assuming now that the thickness along the z direction is selected to be 10 mm, the shape of the 180-degree pulse is the sinc function having the 3 peaks, and also the irradiation time is selected to be 2 ms, the strength Gz of the slice selective gradient magnetic field pulse is given as 4/(γ×t×Δz)=4.7 mT/m.

The sampling point number N is equal to Wx/ΔWx=8, and the sampling rate Δt is given as b/N=30.5826 μs. Since 64 pieces of RF pulses are irradiated in this embodiment, 64 pieces of echoes are measured.

Assuming now that the visual field Wy along the y direction is made equal to Wx, namely 256 mm, the spatial resolution along the y direction becomes 4 mm, assuming now to the entire information along the y direction is acquired by using the 64 echoes, and also the pixel number along the y direction is selected to be 64. At this time, the strength Gy of the phase encode gradient magnetic field pulse becomes 1/(γ×b×Wy)=0.375 mT/m.

The flip angle of the RF pulse is equal to 90 degrees/64= 1.4 degrees. Since the excitation time and the echo measuring time are approximately 16 ms, respectively, and further the irradiation time of the 180-degree pulse is 2 ms, a time period defined from the commencement of the excitation until the end of the echo measurement is equal to approximately 40 ms even if the rising time of other gradient magnetic pulse is involved.

While the position of the slice is shifted by way of any one of the previously explained methods for acquiring the overall information about the object under examination, the above-explained measurement is repeatedly performed. It should also be noted that since the slice interval is 32 mm and the slice thickness is 1 mm, a total repetition number of the above-described measurement becomes 32.

Also, the shift amount is made equal to the slice thickness, namely 1 mm. This shift amount becomes 2/(b×n)=127.728 Hz under the carrier frequency of the RF pulse. Since the different regions are excited every time the measurement is repeated, the waiting time for the recovery of magnetization is no longer required when the measurement is repeatedly performed. As a consequence, the overall measuring time becomes approximately 40 ms×32=1.28 s.

Since the above-explained measurement is carried out, such an image can be acquired within the imaging time of 1.28 s, namely the visual field of 256 mm×256 mm; the spatial resolution of 1 mm×4 mm; and the pixel number of 256×64.

In accordance with this method, since the readout gradient magnetic field strength is very low, the images having the high resolution can be imaged in very high speeds by the substantially all of MRI apparatuses.

EMBODIMENT MODE 2

Figure 19:
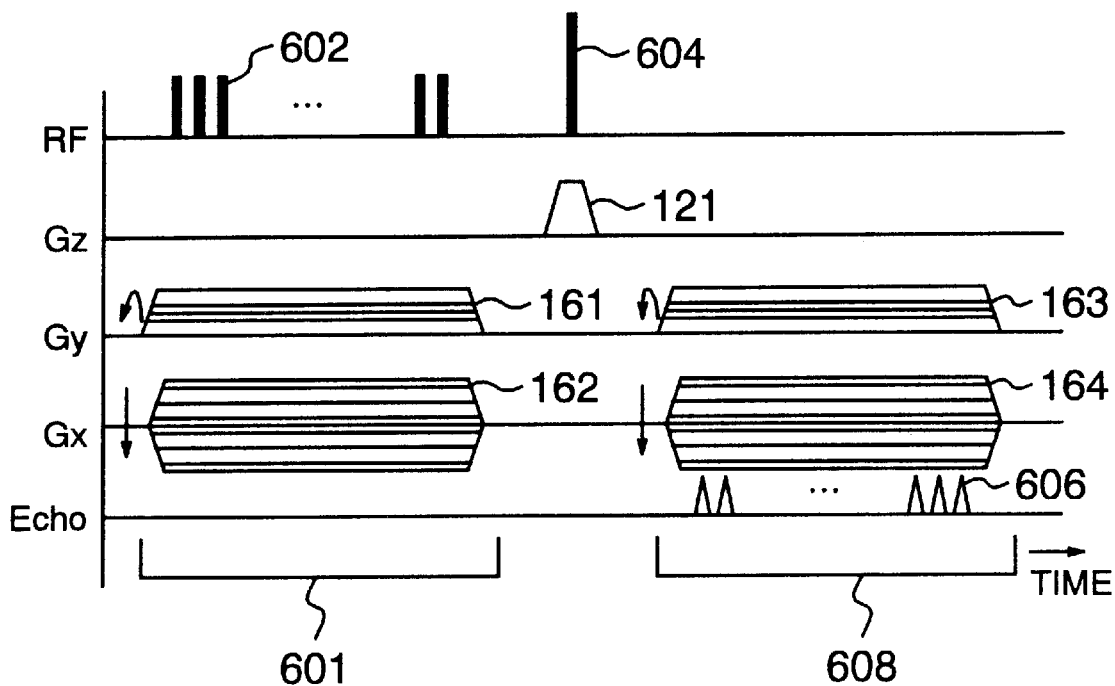
FIG. 19 is a diagram for representing a pulse sequence of an imaging method with employment of a spatial resolution control unit according to an embodiment mode 2.

FIG. 19 is a diagram for showing a pulse sequence of an imaging method with employment of a spatial resolution control unit according to an embodiment mode 2. This pulse sequence is to use a projection method of an MRI apparatus.

In accordance with this pulse sequence, echoes 606 are measured in such a manner that gradient magnetic field pulses 161 and 162 are applied while an RF pulse 602 is irradiated; a specific range along a z direction is inverted by way of a 180-degree pulse 604 and a slice selective gradient magnetic field pulse 121; and readout gradient field pulses 163 and 164 having the same strengths as those of the gradient magnetic field pulses 161 and 162 under excitation are applied. In this pulse sequence, the direction of the gradient magnetic field pulse becomes such a direction determined by Gx+Gy.

As described above, the spatial resolution control portion 601 of the pulse sequence is in principle identical to that of the method as described in the embodiment mode 1 except that the direction of the gradient magnetic field pulse is different.

When the respective echoes are processed by the inverse Fourier transform, projections along the corresponding directions are acquired. At this time, since a plurality of echoes having different echo time are measured by executing the pulse sequence 1 time, a plurality of projections along the same direction can be produced.

Normally, in the projection method, only one echo along the same direction may be sufficiently required. As a consequence, for example, all of the echoes along the same direction may be accumulated so as to improve the S/N ratio. Alternatively, in such a case that since a diffusion of a tissue becomes large, if all of these echoes are multiplied with each other, then the image quality is deteriorated, the S/N ratio may be increased by using only the first echoes. Alternatively, when an image having a specific contrast is wanted to be imaged, only the echoes of this echo time may be used.

Figure 20:
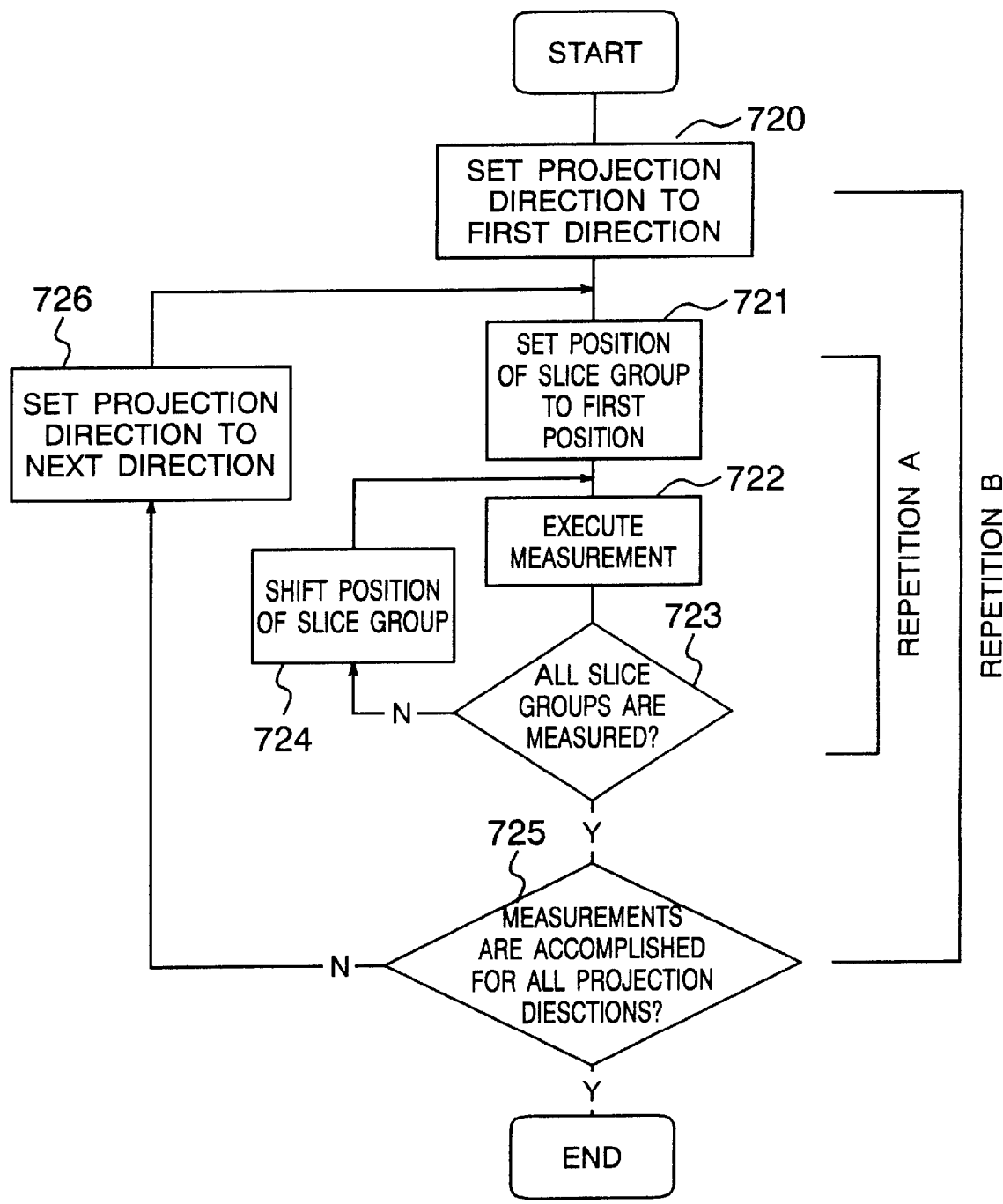
FIG. 20 is a flow chart for describing a measurement executed by the pulse sequence of FIG. 19.

The imaging operation is carried out by repeating this pulse sequence in a dual manner, as shown in FIG. 20. A first repetition "A" (720 to 724) is carried out in order to measure a projection along a specific direction while shifting a position of a slice group (724).

As previously described, this first repetition is performed by changing the carrier frequency of the RF pulse. At this time, Gx and Gy are made constant.

A second repetition "B" (720 to 726) is carried out so as to change a direction of a projection while changing the strengths of the gradient magnetic field pulses Gx and Gy (726).

In this second repletion B, the gradient magnetic field pulses 161 and 163 each have the same strengths, and also the gradient magnetic field pulses 162 and 164 each have the same strengths. The changing order of the gradient magnetic field pulse strength is defined by such a way that each of the echoes passes through the origin of the k space and further scans the entire k space.

Figure 21:
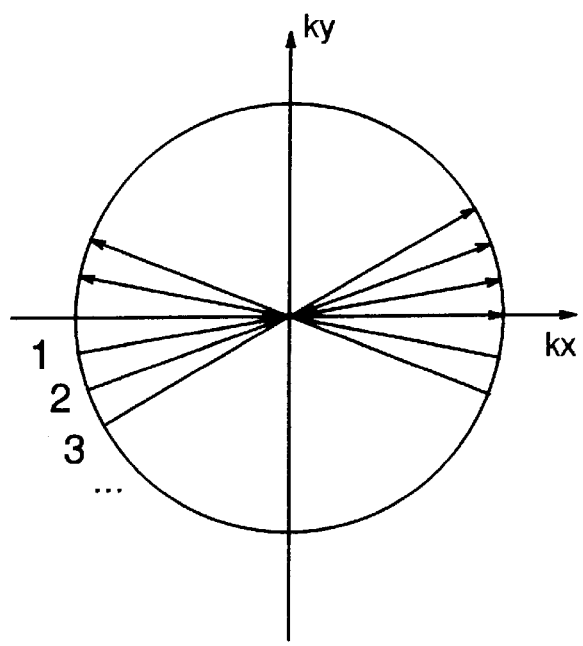
FIG. 21 is a diagram for explaining a method for scanning a measuring space in the pulse sequence according to the embodiment mode 2.

For example, as indicated in FIG. 19, "x" passes from a plus to a minus, and "y" passes from 0 to a plus and is again returned to 0. At this time, each of the echoes scans the k space, as indicated in FIG. 21.

Although the order of the repetition A and the repetition B is arbitrarily determined, as indicated in FIG. 20, the repetition A is normally performed within the repetition B. In other words, first of all, the direction of the projection is determined (720), and the repetition A is carried out to measure a perfect projection in this direction. Next, while the direction of the projection is changed (726), the repetition A is again performed.

Since the different regions are excited in the repetition A, no waiting time is required, whereas since the waiting time is required in the repetition B, if such an order is employed, then the imaging operation can be accomplished within short time.

A method for producing a projection from the respective echoes measured in the repetition A may be realized by such that in the method explained in the embodiment mode 1, shown in FIG. 12, only the x direction may be employed. Although this process operation may be executed after the imaging operation has been accomplished, if this process operation is carried out every time the repetition A is ended, then the process operation required after the imaging operation has been accomplished can be shortened.

Figure 22:
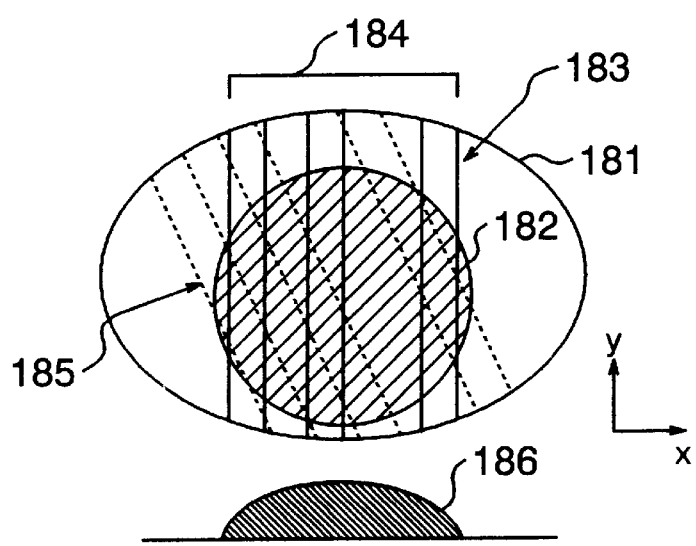
FIG. 22 is an illustration for describing a relationship between a visual field and a project, and also another relationship between the visual field and an excited region in the pulse sequence according to the embodiment mode 2.

A relationship between a visual field and a projection, and another relationship between a visual field and an excitation region are represented in FIG. 22.

In FIG. 22, reference numeral 181 indicates an object under examination; reference numeral 182 denotes a visual field, and reference numerals 183 and 184 indicate an excitation slice group and an excitation region of the first repetition B, respectively. Also, reference numeral 185 shows an excitation slice group of the second repetition B; and reference numeral 186 shows a projection measured in the first repetition B.

A method for reconstructing an image from the projections along the respective directions, which have been acquired by the above-explained sequential operation, may be realized by employing the image reconstructing method used in the normal X-ray CT apparatus. That is, for example, there are the sequential approximating method, the 2-dimensional Fourier transforming method, and the filter correction back-projection method. The filter correction back-projection method contains the filter correction method by the Fourier transform and the convolution method. These methods are described in the Japanese book "Current Medical Image Diagnostic Apparatus" written by H. KIMURA, ASAKURA BOOKSTORE, in 1988.

As previously described in detail, similar to the embodiment mode 1, also in the magnetic resonance imaging apparatus of this embodiment mode 2, since the image having the high resolution can be imaged without applying the strong magnetic field to the object under examination, the microscopy can be applied also to the human body.

EMBODIMENT MODE 3

Figure 23:
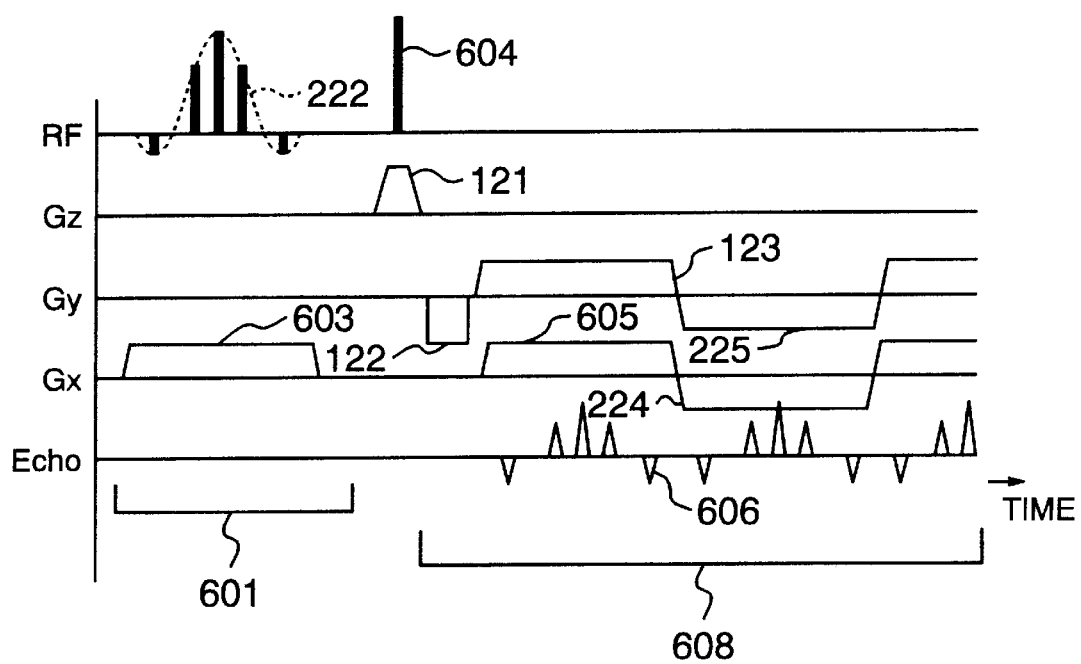
FIG. 23 is a diagram for showing a pulse sequence according to an embodiment mode 3.

FIG. 23 is a diagram for representing a pulse sequence according to an embodiment mode 3, and shows another example of a spatial resolution control portion. In this embodiment, the shape of the pulse 805 shown in FIG. 8 is replaced by a sinc function.

Similar to the previous case of FIG. 10, in FIG. 23, as represented in a spatial resolution control portion 601, the spatial resolution control unit 401 irradiates a plurality of RF pulses 222 while applying the gradient magnetic field pulse 603.

A strength of each of the RF pulses is amplitude-modulated in such a manner that the RF pulses become a sinc function having 3 peaks, as indicated by a dotted line shown in FIG. 23. This corresponds to such a fact that the rectangular wave 805 shown in FIG. 8 is replaced by the sinc function having the 3 peaks. Either an excitation profile 811 or 812 of each slice is approximated to the rectangle, not to the sinc function.

As a result, since a large number of magnetizations are uniformly excited within each of the slices, the image quality and the S/N ratio may be increased. Even when the RF pulses are frequency-modulated, or phase-modulated, instead of amplitude-modulated, a similar effect may be achieved.

Since the amplitude of the slope is small in the amplitude modulation by the sinc function, the total number of RF pulses which can be irradiated cannot be increased, so that a total number of produced echoes is small. In the embodiment mode 3 shown in FIG. 23, a total number of RF pulse is 5. As a result, in the case that the amplitude modulation is employed in the pulse sequences shown in FIG. 10 and FIG. 19, only 5 pieces of echoes can be obtained. In accordance with the projection method with employment of the pulse sequence shown in FIG. 19, since only one echo is required, this amplitude modulation can be satisfied with this echo quantity.

However, in the case of the Fourier transform method shown in FIG. 10, more echoes are needed. For example, 64 pieces of echoes are required. To this end, as in the gradient magnetic field strength control portion 608 of FIG. 23, the readout gradient magnetic field pulse 224 and the phase encode gradient field pulses 225 are inverted, respectively, and then these inverted gradient magnetic field pulses are applied. This operation is repeatedly performed so as to increase the total number of echoes. Alternatively, this method may be combined with the k-space subdivision measuring method so as to increase the total number of echoes.

As previously described in the embodiment mode 1, also in the magnetic resonance imaging apparatus of this embodiment mode 3, since the image having the high resolution can be imaged without applying the strong magnetic field to the object under examination, the microscopy can be applied also to the human body.

EMBODIMENT MODE 4

In this embodiment, a desirable image is produced by calculating a difference between an image obtained by exciting a portion other than an observating portion, and another image acquired by exciting an entire portion.

Figure 24:
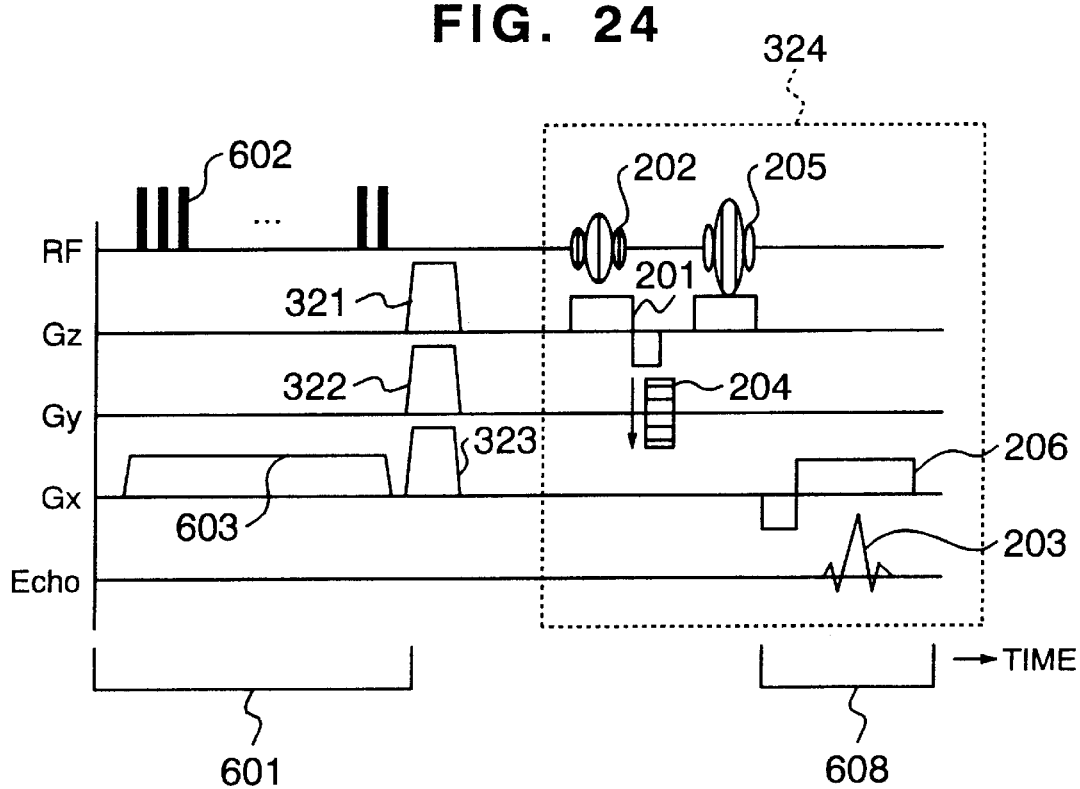
FIG. 24 is an illustration for explaining a pulse sequence of a magnetic resonance imaging apparatus according to an embodiment mode 4 of the present invention.
Figure 25:
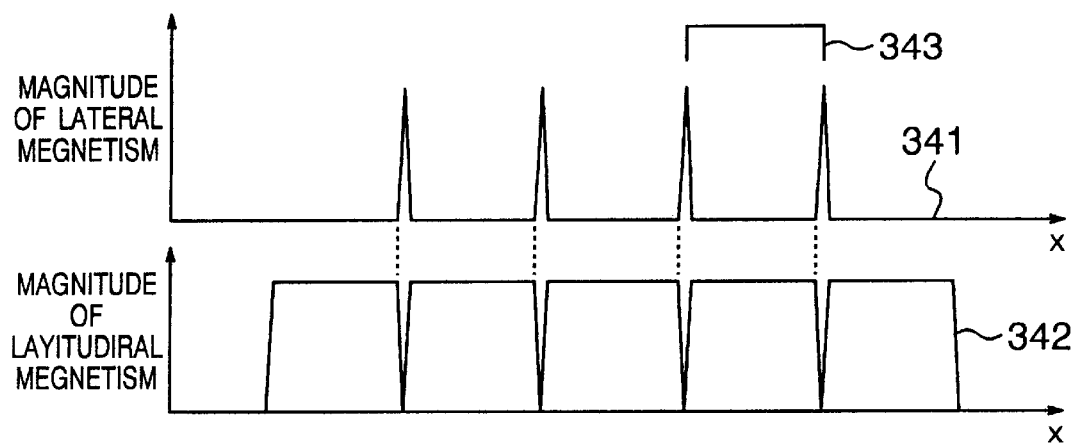
FIG. 25 is a diagram for explaining a basic idea of the pulse sequence according to the embodiment mode 4 shown in FIG. 24.
Figure 26:
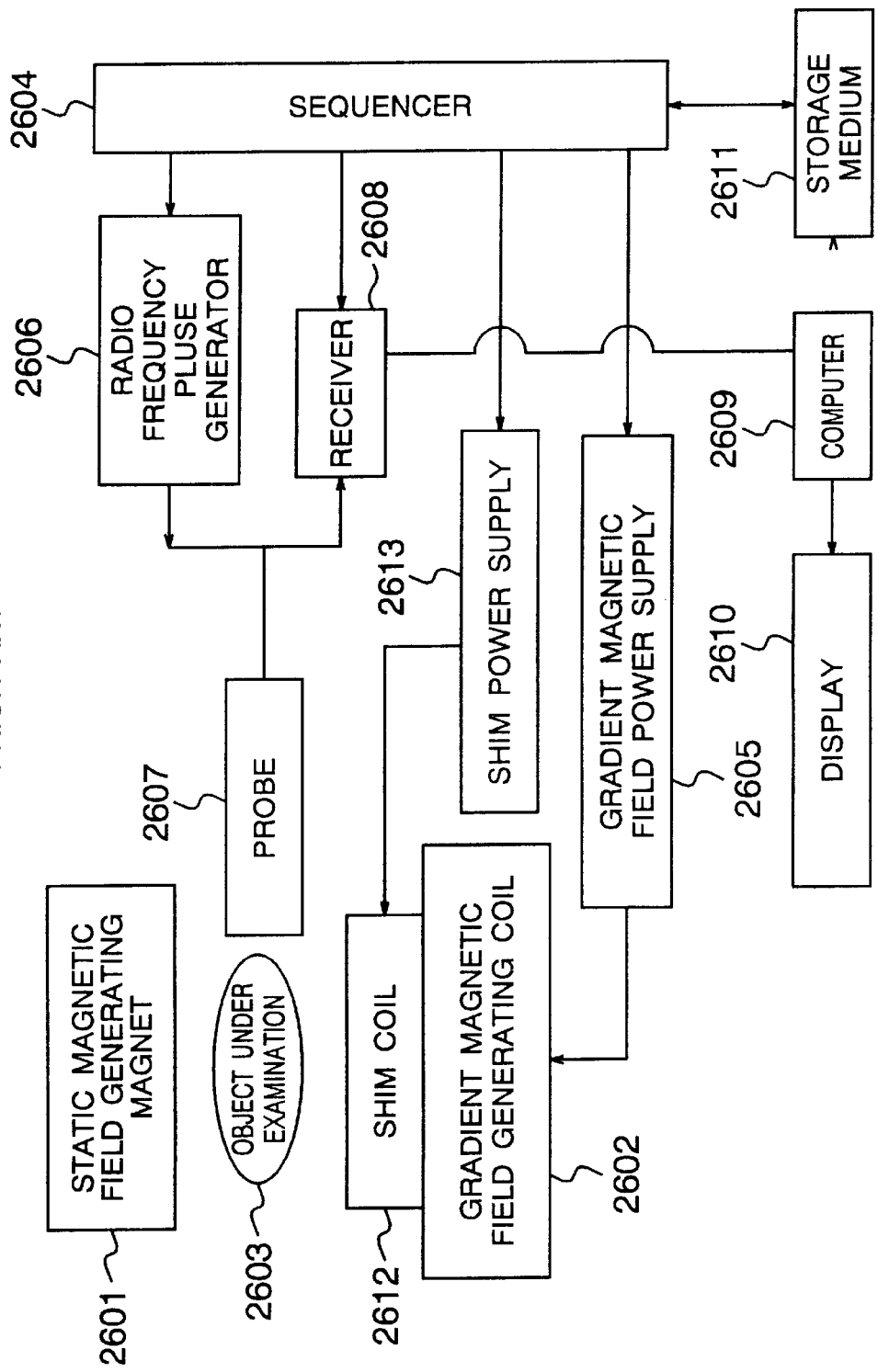
FIG. 26 is a block diagram for schematically showing the arrangement of the conventional magnetic resonance imaging apparatus.
Figure 27:
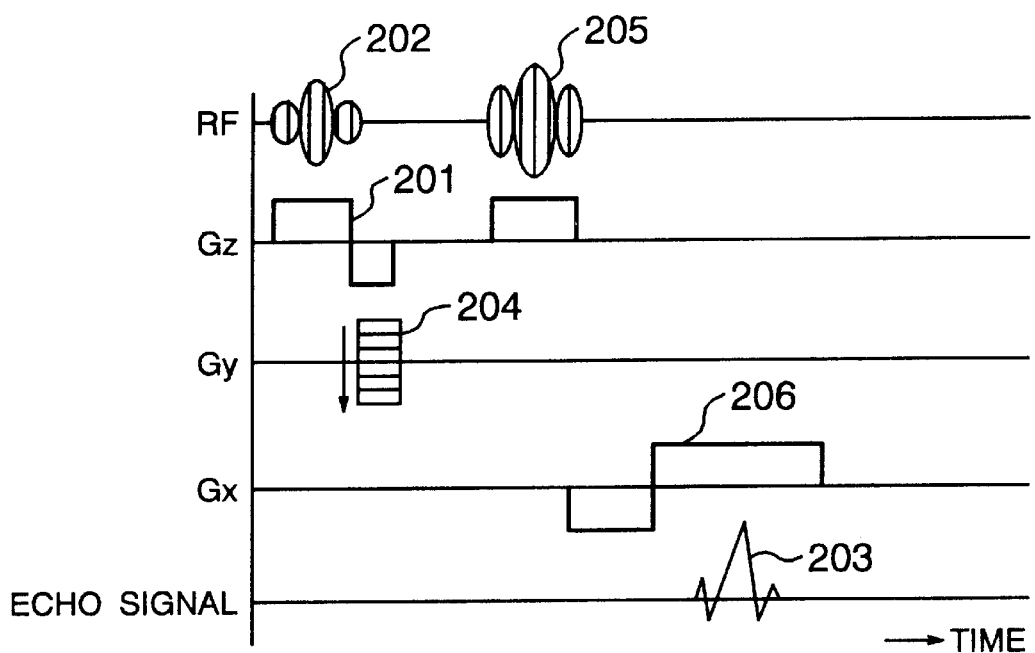
FIG. 27 is a diagram for explaining a pulse sequence in the conventional magnetic resonance imaging apparatus.
Figure 28:
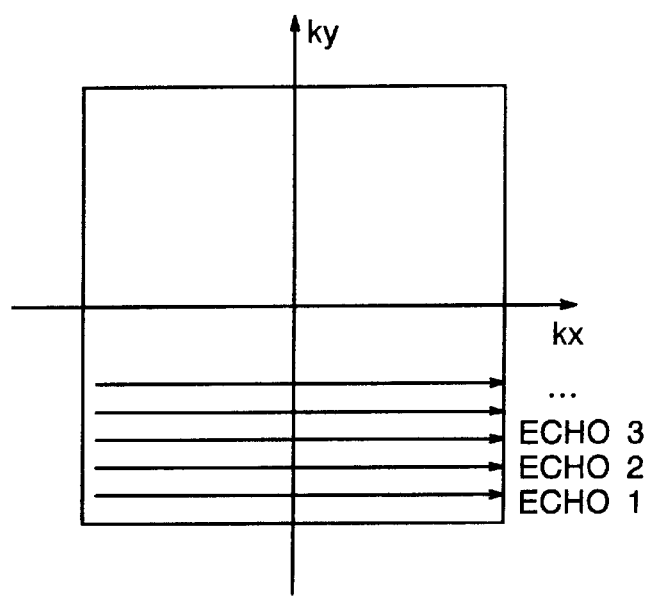
FIG. 28 is an illustration for describing the measuring space.
Figure 29A:
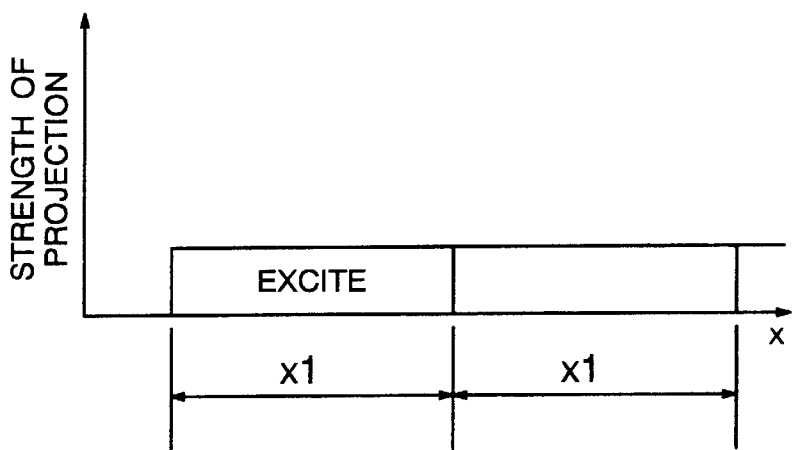
FIG. 29A and FIG. 29B are illustrations for explaining a basic idea of the present invention.
Figure 29B:

FIG. 24 is an explanatory diagram for explaining a pulse sequence of a magnetic resonance imaging apparatus according to an embodiment mode 4 according to the present invention. FIG. 25 is an explanatory diagram for explaining a basic idea of the pulse sequence shown in FIG. 24. Referring now to FIG. 25, the pulse sequence shown in FIG. 24 will be explained.

A pulse sequence indicated by a dotted line, equal to a rear half portion 324 of the pulse sequence, corresponds to the normal imaging pulse sequence of the well-known spin echo method, or echo planer method. As one example of this embodiment mode, the spin echo method is indicated.

The spatial resolution control portion 601 is constructed of a plurality of RF pulses 602 and a gradient magnetic field pulse 603.

When an unnecessary echo is produced to deteriorate an image quality at this time, spoiler gradient magnetic field pulses 321, 322, and 323 are applied to Gz, Gy, Gx, respectively. On the other hand, when such an unnecessary echo is not produced, the spoiler gradient magnetic field pulses 321, 322, 323 are not applied because the applications of these spoiler gradient magnetic field pulses may cause useless measuring time.

The object under examination is excited as shown in FIG. 7 of the embodiment mode 1 by the RF pulse 602 and the gradient magnetic field pulse 603.

At this time, only the excitation along the x direction is illustratively shown in 341 of FIG. 25. An ordinate indicates a magnitude of a lateral magnetization immediately after the spatial resolution control portion 601 is ended.

When the spoiler gradient magnetic field pulses 321, 322, 323 are applied at this stage, the phase of the lateral magnetization is disturbed, which may be brought into such a no echo occurrence condition. At this time, the magnitude of the longitudinal magnetization is brought into such a condition that a portion 342 where the lateral magnetism is produced is dropped out.

When the RF pulse 202 is irradiated at this time, a profile of the lateral magnetism along the readout direction also becomes 342. Thereafter, when the imaging operation is carried out by using the normal pulse sequence 324, a resulting image "D" becomes such an image from which information about a slice portion has been dropped. It should be noted that in the pulse sequence 324, the spatial resolution determined by the readout gradient magnetic field strength and the sampling time period is set to an interval 343 of slices.

When the image "D" is subtracted from another image "E" having no dropped portion, an image containing the information about only the slice portion can be formed.

The image E may be imaged by employing only the pulse sequence 324 without using the spatial resolution control portion 601. Only one piece of this image E can be satisfied.

Next, while the position of the slice is shifted (moved), the image containing the information about only the slice portion is produced with the pulse sequence of FIG. 24. Similar to FIG. 12 of the embodiment 1, the respective images are combined with each other, so that it is possible to obtain such an image having higher spatial resolution than the spatial resolution determined by the readout gradient magnetic field strength.

It should also be noted that a similar effect may be achieved even when a difference (E'-D') is calculated between states D' and E' of a K space before an image reconstruction is carried out, and thereafter a 2-dimensional inverse Fourier transform is carried out, instead of the image subtraction.

In the case that the normal pulse sequence 324 requires that the excitation and the echo measurement must be repeated as in the spin echo method, the spatial resolution control portion 601 may be executed every time the excitation and the echo measurement are repeated. This is because the magnetization is recovered while time has passed, and the profiles 341 and 342 of the magnetization are disturbed. It should be understood that when the repetition interval is short, e.g., several ms to several hundreds ms, the spatial resolution control portion 601 may be executed only in the first time, or every 1 time when the repetition is performed several times.

As previously described in detail, similar to the embodiment mode 1, also in the magnetic resonance imaging apparatus of this embodiment mode 4, since the image having the high resolution can be imaged without applying the strong magnetic field to the object under examination, the microscopy can be applied also to the human body.

While the present invention has been described with reference to the concrete embodiment modes thereof, the present invention is not limited only to these embodiment modes, but may be modified without departing from the technical scope and spirit of the present invention.

Further, when the excited portion is shifted, an overlap with a portion which was previously excited is allowed.

What is claimed is:

1. In a magnetic resonance imaging apparatus including pulse sequence control means for controlling a pulse sequence to acquire echoes while both a radio frequency magnetic field and a gradient magnetic field are applied to an object under examination present in a static magnetic field and image reconstructing means for reconstructing an image based upon the acquired echoes, wherein said pulse sequence control means is comprised of spatial resolution control means for setting spatial resolution A along a readout gradient magnetic field direction of said reconstructed image and gradient magnetic field strength control means for applying such a readout gradient magnetic field that spatial resolution B determined by a strength of the readout gradient magnetic field and a sampling period becomes coarser than the spatial resolution A, said spatial resolution control means includes means for setting the spatial resolution A by irradiating the radio frequency magnetic field so as to selectively excite a portion of the object under examination.

2. A magnetic resonance imaging apparatus as claimed in claim 1 wherein:

said pulse sequence control means includes means for executing a first pulse sequence for acquiring first echoes by applying both said radio frequency magnetic field and said gradient magnetic field, and means for executing a second pulse sequence for acquiring second echoes by executing said first pulse sequence after an excited portion of said object under examination with a width of said spatial resolution A is saturated, and said image reconstructing means includes a difference processing means for executing a difference process operation between said first and second echoes.

3. A magnetic resonance imaging apparatus as claimed in claim 1 wherein:

said pulse sequence control means includes means for executing a first pulse sequence for acquiring first echoes by applying both said radio frequency magnetic field and said gradient magnetic field, and means for executing a second pulse sequence for acquiring second echoes by executing said first pulse sequence after an excited portion of said object under examination with a width of said spatial resolution A is saturated, and said image reconstructing means includes means for executing a difference process operation with respect to the images reconstructed respectively from said first echoes and from said second echoes.

4. A magnetic resonance imaging apparatus as claimed in claim 1 wherein:

said image reconstructing means includes means for reconstructing a partial image by using echoes which have been measured at this time every time said pulse sequence is repeatedly performed.

5. A magnetic resonance imaging apparatus as claimed in claim 1 wherein:

said image reconstructing means includes means for reconstructing a partial image by using echoes which have been measured at this time every time said pulse sequence is repeatedly performed and means for displaying said partial image on a display apparatus.

6. In a magnetic resonance imaging apparatus including pulse sequence control means for controlling a pulse sequence to acquire echoes while both a radio frequency magnetic field and a gradient magnetic field are applied to an object under examination present in a static magnetic field and image reconstructing means for reconstructing an image based upon the acquired echoes, wherein said pulse sequence control means is comprised of spatial resolution control means for setting spatial resolution A along a readout gradient magnetic field direction of said reconstructed image and gradient magnetic field strength control means for applying such a readout gradient magnetic field that spatial resolution B determined by a strength of the readout gradient magnetic field and a sampling period becomes coarser than the spatial resolution A, said spatial resolution control means includes means for exciting a region within the object under examination in a slice group whose slices are located substantially perpendicular to said readout gradient magnetic field direction and positioned in a substantially equi-interval, and said gradient magnetic field strength control means includes means for setting said spatial resolution B to be substantially equal to a slice interval of said slices.

7. A magnetic resonance imaging apparatus as claimed in claim 6 wherein:

said pulse sequence control means includes means for repeatedly executing said pulse sequence preselected times, while the position of said slice group is moved in such a direction along which the readout gradient magnetic field is applied.

8. A magnetic resonance imaging apparatus as claimed in claim 6 wherein:

said pulse sequence control means includes means for changing the frequency of said radio frequency magnetic field pulse every time said predetermined pulse sequence is repeated.

9. A magnetic resonance imaging apparatus as claimed in claim 6 wherein:

said pulse sequence control means includes means for changing a strength of the static magnetic field every time said predetermined pulse sequence is repeated.

10. In a magnetic resonance imaging apparatus including pulse sequence control means for controlling a pulse sequence to acquire echoes while both a radio frequency magnetic field and a gradient magnetic field are applied to an object under examination present in a static magnetic field and image reconstructing means for reconstructing an image based upon the acquired echoes, wherein said pulse sequence control means is comprised of spatial resolution control means for setting spatial resolution A along a readout gradient magnetic field direction of said reconstructed image and gradient magnetic field strength control means for applying such a readout gradient magnetic field that a spatial resolution B determined by a strength of the readout gradient magnetic field and a sampling period becomes coarser than the spatial resolution A, said spatial resolution control means includes means for applying an excitation gradient magnetic field along the same direction as that of said readout gradient magnetic field and means for irradiating said radio frequency magnetic field pulses plural times in a substantially equi-interval.

11. A magnetic resonance imaging apparatus as claimed in claim 10 wherein:

said spatial resolution control means includes means for making amplitudes of said plurality of radio frequency magnetic field pulses constant, and for applying them.

12. A magnetic resonance imaging apparatus as claimed in claim 10 wherein:

said spatial resolution control means includes means for making said plurality of radio frequency magnetic field pulses amplitude-modulated, and for applying them.

13. A magnetic resonance imaging apparatus as claimed in claim 10 wherein:

said spatial resolution control means includes means for making said plurality of radio frequency magnetic field pulses frequency-modulated, and for applying them.

14. A magnetic resonance imaging apparatus as claimed in claim 10 wherein:

said spatial resolution control means includes means for making said plurality of radio frequency magnetic field pulses phase-modulated, and for applying them.

15. In a magnetic resonance imaging apparatus including pulse sequence control means for controlling a pulse sequence to acquire echoes while both a radio frequency magnetic field and a gradient magnetic field are applied to an object under examination present in a static magnetic field and image reconstructing means for reconstructing an image based upon the acquired echoes wherein said pulse sequence control means executes controls of setting spatial resolution A along a readout gradient magnetic field direction of said reconstructed image by irradiating the radio frequency magnetic field so as to selectively excite a portion of the object under examination and applying such a readout gradient magnetic field that spatial resolution B determined by a strength of the readout gradient magnetic field and a sampling period becomes coarser than the spatial resolution A.

16. A magnetic resonance imaging apparatus as claimed in claim 15 wherein:

said pulse sequence control means includes a control of a first pulse sequence for acquiring first echoes by applying both said radio frequency magnetic field and said gradient magnetic field and a control of a second pulse sequence for acquiring second echoes by executing said first pulse sequence after an excited portion of said object under examination with a width of said spatial resolution A is saturated, and said image reconstructing means includes a difference processing means for executing a difference process operation between said first and second echoes.

17. A magnetic resonance imaging apparatus as claimed in claim 15 wherein:

said pulse sequence control means includes a control of a first pulse sequence for acquiring first echoes by applying both said radio frequency magnetic field and said gradient magnetic field and a control of a second pulse sequence for acquiring second echoes by executing said first pulse sequence after an excited portion of said object under examination with a width of said spatial resolution A is saturated, and said image reconstructing means includes means for executing a difference process operation with respect to the images reconstructed respectively from said first echoes and from said second echoes.

18. A magnetic resonance imaging apparatus as claimed in claim 15 wherein:

said image reconstructing means includes means for reconstructing a partial image by using echoes which have been measured at this time every time said pulse sequence is repeatedly performed.

19. A magnetic resonance imaging apparatus as claimed in claim 15 wherein:

said image reconstructing means includes means for reconstructing a partial image by using echoes which have been measured at this time every time said pulse sequence is repeatedly performed and means for displaying said partial image on a display apparatus.

20. In a magnetic resonance imaging apparatus including pulse sequence control means for controlling a pulse sequence to acquire echoes while both a radio frequency magnetic field and a gradient magnetic field are applied to an object under examination present in a static magnetic field and image reconstructing means for reconstructing an image based upon the acquired echoes, wherein said pulse sequence control means executes controls of setting spatial resolution A along a readout gradient magnetic field direction of said reconstructed image by exciting a region within the object under examination in a slice group whose slices are located substantially perpendicular to said readout gradient magnetic field direction and positioned in a substantially equi-interval and setting spatial resolution B determined by a strength of the readout gradient magnetic field and a sampling period to be substantially equal to a slice interval of said slices.

21. A magnetic resonance imaging apparatus as claimed in claim 20 wherein:

said pulse sequence control means executes a control of repeatedly executing said pulse sequence preselected times, while the position of said slice group is moved in such a direction along which the readout gradient magnetic field is applied.

22. A magnetic resonance imaging apparatus as claimed in claim 20 wherein:

said pulse sequence control means executes a control of changing a frequency of said radio frequency magnetic field pulse every time said predetermined pulse sequence is repeated.

23. A magnetic resonance imaging apparatus as claimed in claim 20 wherein:

said pulse sequence control means executes a control of changing a strength of the static magnetic field every time said predetermined pulse sequence is repeated.

24. In a magnetic resonance imaging apparatus including pulse sequence control means for controlling a pulse sequence to acquire echoes while both a radio frequency magnetic field and a gradient magnetic field are applied to an object under examination present in a static magnetic field and image reconstructing means for reconstructing an image based upon the acquired echoes, wherein said pulse sequence control means executes controls of setting spatial resolution A along a readout gradient magnetic field direction of said reconstructed image, applying such a readout gradient magnetic field that spatial resolution B determined by a strength of the readout gradient magnetic field and a sampling period becomes coarser than the spatial resolution A, applying an excitation gradient magnetic field along the same direction as that of said readout gradient magnetic field an irradiating said radio frequency magnetic field pulses plural times in a substantially equi-interval.

25. A magnetic resonance imaging apparatus as claimed in claim 24 wherein:

said pulse sequence control means executes a control of making amplitudes of said plurality of radio frequency magnetic field pulses constant and applying them.

26. A magnetic resonance imaging apparatus as claimed in claim 24 wherein:

said pulse sequence control means executes a control of making said plurality of radio frequency magnetic field pulses amplitude-modulated and applying them.

27. A magnetic resonance imaging apparatus as claimed in claim 24 wherein:

said pulse sequence control means executes a control of making said plurality of radio frequency magnetic field pulses frequency-modulated and applying them.

28. A magnetic resonance imaging apparatus as claimed in claim 24 wherein:

said pulse sequence control means executes a control of making said plurality of radio frequency magnetic field pulses phase-modulated and applying them.

29. A magnetic resonance imaging apparatus including pulse sequence control means for controlling a pulse sequence to acquire echoes while both a radio frequency magnetic field and a gradient magnetic field are applied to an object under examination present in a static magnetic field, imaging reconstructing means for reconstructing an image based upon the acquired echoes and a display means for displaying an image reconstructed, wherein said pulse sequence control means executes controls of;

(1) selectively exciting a plurality of portions within said object under examination by irradiating a plurality of radio frequency magnetic field pulses while applying a gradient magnetic field along a readout direction;

(2) measuring an echo by using such a readout gradient magnetic field and a sampling time period that spatial resolution determined by a strength of said readout gradient magnetic field and said sampling time period becomes larger than a width of an excited portion; and said image reconstructing means reconstructs an image from said measured echo while a width of said excited portion is set as 1 pixel of a reconstructed image.

30. A magnetic resonance imaging apparatus as claimed in claim 29, wherein said pulse sequence control means executes a control of repeating said controls (1) and (2) plural times, and (3) sequentially changing a position of a portion to be excited within said object under examination every time of repetition.

31. A magnetic resonance imaging apparatus as claimed in claim 30 wherein:

said control (2) includes a control of setting both the strength of said readout gradient magnetic field and said sampling time period in such a manner that an interval between excited portions is equal to a dimension of spatial resolution determined by the strength of said readout gradient magnetic field and said sampling time period, and said control (3) includes a control of sequentially changing a position of a portion to be excited by a width of said excited portion.

32. A magnetic resonance imaging apparatus as claimed in claim 30 wherein:

said control (3) includes a control of changing the strength of said static magnetic field to thereby change a position of said portion to be excited.

33. A magnetic resonance imaging apparatus as claimed in claim 30, wherein said pulse sequence control means includes a control (4) of changing the readout direction and of repeatedly performing said controls (1) and (2) every time the readout direction is changed.

34. A magnetic resonance imaging apparatus as claimed in claim 30 wherein:

said image reconstructing means reconstructs an image every time said controls (1) and (2) are repeated.

35. A magnetic resonance imaging apparatus as claimed in claim 34 wherein:

said display means displays the reconstructed image every time said controls (1) and (2) are repeated.

36. A magnetic resonance imaging apparatus as claimed in claim 30 wherein:

said control (3) includes a control of changing a carrier frequency of said radio frequency magnetic field pulses to thereby change a position of said portion to be excited.

37. A magnetic resonance imaging apparatus as claimed in claim 29 wherein:
said control (1) includes a control of making amplitudes of said radio frequency magnetic field pulses constant and applying them.

38. A magnetic resonance imaging apparatus as claimed in claim 29 wherein:
said control (1) includes a control of amplitude-modulating said radio frequency magnetic field pulses and applying them.

39. A magnetic resonance imaging apparatus as claimed in claim 29 wherein:
said control (1) includes a control of frequency-modulating said radio frequency magnetic field pulses and applying them.

40. A magnetic resonance imaging apparatus as claimed in claim 29 wherein:
said control (1) includes a control of phase-modulating said radio frequency magnetic field pulses and applying them.

41. A magnetic resonance imaging apparatus as claimed in claim 29 wherein:
said control (2) includes a control of sampling the echoes while applying a phase encoding gradient magnetic field to said object under examination.

42. A magnetic resonance imaging apparatus as claimed in claim 41 wherein:
said control (2) includes a control of applying said phase encoding gradient magnetic field having a strength substantially equal to that of said readout gradient magnetic field.

43. A magnetic resonance imaging apparatus as claimed in claim 29, wherein said pulse sequence control means executes a control of irradiating a 180-degree pulse between said control (1) and said control (2).

44. A magnetic resonance imaging apparatus as claimed in claim 29 wherein:
said control (2) includes a control of measuring said echo while inverting said readout gradient magnetic field.

45. A magnetic resonance imaging apparatus as claimed in claim 29, wherein said pulse sequence control means executes a control of executing a pulse sequence used to saturate a magnetic resonance signal derived from a region except for a region of interest of said object under examination before said controls (1) and (2) are executed.

46. A magnetic resonance imaging apparatus as claimed in claim 29 wherein:
said image reconstructing means accumulates a plurality of images with each other based upon said echoes to thereby reconstruct an image.

47. A magnetic resonance imaging method comprising:
(1) a step in which while a gradient magnetic field along a readout direction is applied to an object under examination within a static magnetic field, a plurality of radio frequency magnetic field pulses are irradiated to the object under examination so as to selectively excite a plurality of portions within said object under examination;
(2) a step in which echoes are measured by using such a readout gradient magnetic field and a sampling time period that spatial resolution determined by a strength of said readout gradient magnetic field and said sampling time period becomes larger than a width of an excited portion; and
(3) a step in which an image is reconstructed from said measured echo while the width of said excited portion is set as 1 pixel of a reconstructed image.

48. A magnetic resonance imaging method as claimed in claim 47, further comprising:
a step for repeatedly performing said steps (1) and (2) plural times, and for sequentially changing a position of a portion to be excited within said object under examination every time said steps (1) and (2) are repeated.

49. A magnetic resonance imaging method as claimed in claim 48 wherein:
said echo measuring step includes a step for setting both the strength of said readout gradient magnetic field and said sampling time period in such a manner than an interval between excited portions is equal to a dimension of spatial resolution determined by the strength of said readout gradient magnetic field and said sampling time period; and said step for sequentially changing the position of the portion to be excited includes a step for changing a position of a portion to be excited by a width of said excited portion.

50. A magnetic resonance imaging method as claimed in claim 48 wherein:
said exciting step includes a step for changing a carrier frequency of said radio frequency magnetic field pulses to thereby change a position of said portion to be excited.

51. A magnetic resonance imaging method as claimed in claim 48 wherein:
said exciting step includes a step for changing a strength of said static magnetic field to thereby change a position of said portion to be excited.

52. A magnetic resonance imaging method as claimed in claim 48, further comprising:
a step for changing the readout direction; and
a step for repeatedly performing said steps (1) and (2) every time the readout direction is changed so as to measure the echoes.

53. A magnetic resonance imaging method as claimed in claim 48 wherein:
said image reconstructing step includes a step for reconstructing an image every time said steps (1) and (2) are repeated.

54. A magnetic resonance imaging method as claimed in claim 53 wherein:
said image reconstructing step includes a step for displaying the reconstructed image every time said steps (1) and (2) are repeated.

55. A magnetic resonance imaging method as claimed in claim 47 wherein:
said exciting step includes a step for making amplitudes of said radio frequency magnetic field pulses constant and for applying them.

56. A magnetic resonance imaging method as claimed in claim 47 wherein:
said exciting step includes a step for amplitude-modulating said radio frequency magnetic field pulses and for applying them.

57. A magnetic resonance imaging method as claimed in claim 47 wherein:
said exciting step includes a step for frequency-modulating said radio frequency magnetic field pulses and for applying them.

58. A magnetic resonance imaging method as claimed in claim 47 wherein:

said exciting step includes a step for phase-modulating said radio frequency magnetic field pulses and for applying them.

59. A magnetic resonance imaging method as claimed in claim 47 wherein:

said echo measuring step includes a step for sampling the echoes while applying a phase encoding gradient magnetic field to said object under examination.

60. A magnetic resonance imaging method as claimed in claim 59 wherein:

said echo measuring step includes a step for applying said phase encoding gradient magnetic field having a strength substantially equal to that of said readout gradient magnetic field.

61. A magnetic resonance imaging method as claimed in claim 47, further comprising:

a step for irradiating a 180-degree pulse between said step (1) and said step (2).

62. A magnetic resonance imaging method as claimed in claim 47 wherein:

said echo measuring step includes a step for measuring said echoes while inverting said readout gradient magnetic field.

63. A magnetic resonance imaging method as claimed in claim 47, further comprising:

a step for executing a pulse sequence used to saturate a magnetic resonance signal derived from a region except for a region of interest of said object under examination before said steps (1) and (2) are executed.

64. A magnetic resonance imaging method as claimed in claim 47 wherein:

said image reconstructing step includes a step for accumulating a plurality of images with each other based upon said echoes to thereby reconstruct an image.

65. A magnetic resonance imaging method comprising:

(1) a step in which while a gradient magnetic field along a readout direction is applied to an object under examination within a static magnetic field, a plurality of radio frequency magnetic field pulses are irradiated to the object under examination so as to selectively excite an internal portion within said object under examination;

(2) a step of making magnetization of a portion selectively excited of said object under examination saturate;

(3) a step in which an entire region containing said portion excited, which corresponds to spatial resolution determined by a strength of a readout gradient magnetic field and a sampling time period, is excited by applying the radio frequency magnetic field to said entire region, and a predetermined pulse sequence is executed to measure a first echo;

(4) a step in which the pulse sequence of said step (3) is solely carried out to thereby measure a second echo; and (5) a step in which an image is reconstructed from difference data between image data acquired from said first echo and the image data acquired from said second echo.

* * * * *